United States Patent
Shang et al.

(10) Patent No.: US 12,310,193 B2
(45) Date of Patent: May 20, 2025

(54) DISPLAY PANEL AND MANUFACTURING METHOD THEREOF, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tinghua Shang, Beijing (CN); Yi Zhang, Beijing (CN); Huijuan Yang, Beijing (CN); Xiaofeng Jiang, Beijing (CN); Yang Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 504 days.

(21) Appl. No.: 17/779,402

(22) PCT Filed: Jun. 17, 2021

(86) PCT No.: PCT/CN2021/100678
§ 371 (c)(1),
(2) Date: May 24, 2022

(87) PCT Pub. No.: WO2022/022150
PCT Pub. Date: Feb. 3, 2022

(65) Prior Publication Data
US 2022/0406864 A1    Dec. 22, 2022

(30) Foreign Application Priority Data
Jul. 31, 2020 (CN) .......................... 202010757566.4

(51) Int. Cl.
*H10K 59/131* (2023.01)
*H10K 59/121* (2023.01)
*H10K 59/12* (2023.01)

(52) U.S. Cl.
CPC ....... *H10K 59/131* (2023.02); *H10K 59/1213* (2023.02); *H10K 59/1216* (2023.02); *H10K 59/1201* (2023.02)

(58) Field of Classification Search
CPC .... G09G 3/32; G09G 3/3225; H10K 59/1213; H10K 59/1216; H10K 59/131; H10K 59/1201
See application file for complete search history.

(56) References Cited

U.S. PATENT DOCUMENTS

| 10,573,236 | B1 | 2/2020 | Gao et al. |
| 2007/0273778 | A1 | 11/2007 | Hsu et al. |

(Continued)

FOREIGN PATENT DOCUMENTS

| CN | 104112422 A | 10/2014 |
| CN | 107481669 A | 12/2017 |

(Continued)

OTHER PUBLICATIONS

Office Action for the Chinese Patent Application No. 202010757566.4 issued by the Chinese Patent Office on Aug. 31, 2022.

*Primary Examiner* — Kyoung Lee
*Assistant Examiner* — Christina A Sylvia
(74) *Attorney, Agent, or Firm* — XSENSUS LLP

(57) ABSTRACT

A display panel has a display region and a non-display region located on a periphery of the display region. The display panel includes: a substrate; a first pixel driving circuit disposed in the display region and including first scanning signal patterns and first active patterns; and a second pixel driving circuit disposed in the non-display (Continued)

region and including second scanning signal patterns and second active patterns. A first scanning signal pattern is coupled to a second scanning signal pattern, and an overlapping area of an orthographic projection of each of at least one first scanning signal pattern on the substrate and orthographic projections of the first active patterns on the substrate is less than an overlapping area of an orthographic projection of each of at least one second scanning signal pattern on the substrate and orthographic projections of the second active patterns on the substrate.

18 Claims, 20 Drawing Sheets

(56) References Cited

U.S. PATENT DOCUMENTS

| | | |
|---|---|---|
| 2014/0313180 A1 | 10/2014 | Woo |
| 2018/0138259 A1 | 5/2018 | Kim et al. |
| 2018/0158417 A1 | 6/2018 | Xiang et al. |
| 2020/0144298 A1 | 5/2020 | Tao et al. |
| 2020/0176527 A1 | 6/2020 | An et al. |
| 2024/0260347 A1* | 8/2024 | Xiao ................... H10K 59/12 |
| 2024/0292659 A1* | 8/2024 | Shang ............... H10K 59/1216 |

FOREIGN PATENT DOCUMENTS

| | | |
|---|---|---|
| CN | 107633812 A | 1/2018 |
| CN | 107749247 A | 3/2018 |
| CN | 108037626 A | 5/2018 |
| CN | 108281104 A | 7/2018 |
| CN | 108417172 A | 8/2018 |
| CN | 108492775 A | 9/2018 |
| CN | 109004007 A | 12/2018 |
| CN | 109272873 A | 1/2019 |
| CN | 109584798 A | 4/2019 |
| CN | 109637374 A | 4/2019 |
| CN | 109728005 A | 5/2019 |
| CN | 109935193 A | 6/2019 |
| CN | 110176465 A | 8/2019 |
| CN | 110189706 A | 8/2019 |

* cited by examiner

DISPLAY PANEL AND MANUFACTURING METHOD THEREOF, AND DISPLAY APPARATUS

CROSS-REFERENCE TO RELATED APPLICATIONS

This application is a national phase entry under 35 USC 371 of International Patent Application No. PCT/CN2021/100678, filed on Jun. 17, 2021, which claims priority to Chinese Patent Application No. 202010757566.4, filed on Jul. 31, 2020, which are incorporated herein by reference in their entirety.

TECHNICAL FIELD

The present disclosure relates to the field of display technologies, and in particular, to a display panel and a manufacturing method thereof, and a display apparatus.

BACKGROUND

In a light-emitting process of a display panel, the design of internal circuits of the display panel, especially the design of pixel driving circuits, plays an important role in the normal display of the display panel. For example, in an organic light-emitting diode (OLED) display panel, the pixel driving circuits are coupled to light-emitting devices to drive the light-emitting devices to emit light, and thus the structures of the pixel driving circuits are crucial for controlling the light-emitting devices to emit light normally.

SUMMARY

In an aspect, a display panel is provided. The display panel has a display region and a non-display region located on a periphery of the display region. The display panel includes a substrate, a first pixel driving circuit and a second pixel driving circuit. The first pixel driving circuit is disposed in the display region, and the first pixel driving circuit includes first scanning signal patterns and first active patterns. The second pixel driving circuit is disposed in the non-display region, and the second pixel driving circuit includes second scanning signal patterns and second active patterns. A first scanning signal pattern is coupled to a second scanning signal pattern. An overlapping area of an orthographic projection of each of at least one first scanning signal pattern on the substrate and orthographic projections of the first active patterns on the substrate is less than an overlapping area of an orthographic projection of each of at least one second scanning signal pattern on the substrate and orthographic projections of the second active patterns on the substrate.

In some embodiments, the first scanning signal patterns and the second scanning signal patterns have the same size.

In some embodiments, in a length direction of the substrate, a size of each of at least one first active pattern is less than a size of each of at least one second active pattern.

In some embodiments, the first scanning signal patterns include at least one of first gate scanning signal patterns or first reset signal patterns. The second scanning signal patterns include at least one of second gate scanning signal patterns or second reset signal patterns.

An overlapping area of an orthographic projection of each of at least one first gate scanning signal pattern on the substrate and the orthographic projections of the first active patterns on the substrate is less than an overlapping area of an orthographic projection of each of at least one second gate scanning signal pattern on the substrate and the orthographic projections of the second active patterns on the substrate.

On this basis, in some other embodiments, an overlapping area of an orthographic projection of each of at least one first reset signal pattern on the substrate and the orthographic projections of the first active patterns on the substrate is less than an overlapping area of an orthographic projection of each of at least one second reset signal pattern on the substrate and the orthographic projections of the second active patterns on the substrate.

In some embodiments, the second pixel driving circuit further includes metal patterns, orthographic projections of the metal patterns on the substrate overlap with orthographic projections of the second scanning signal patterns on the substrate, and the metal patterns are configured to receive voltage signals.

In some embodiments, the second pixel driving circuit further includes a second power supply voltage signal pattern coupled to a metal pattern, and the second power supply voltage signal pattern is configured to provide a second power supply voltage signal to the metal pattern.

In some embodiments, the metal pattern and the second power supply voltage signal pattern are arranged in the same layer and made of the same material.

In some embodiments, the second pixel driving circuit further includes a second initial signal pattern coupled to a metal pattern, and the second initial signal pattern is configured to provide a second initial signal to the metal pattern.

In some embodiments, the non-display region includes a reserved region; and in a length direction of the substrate, first pixel driving circuits are provided in the display region and located on two opposite sides of the reserved region.

In another aspect, a display panel is provided. The display panel has a display region and a non-display region located on a periphery of the display region. The display panel includes a substrate, a first pixel driving circuit, a second pixel driving circuit and metal patterns.

The first pixel driving circuit is disposed in the display region, and the first pixel driving circuit includes first scanning signal patterns and first active patterns.

The second pixel driving circuit is disposed in the non-display region; the second pixel driving circuit includes second scanning signal patterns and second active patterns; and a second scanning signal pattern is coupled to a first scanning signal pattern.

Orthographic projections of the metal patterns on the substrate overlap with orthographic projections of the second scanning signal patterns on the substrate, and the metal patterns are configured to receive voltage signals.

In yet another aspect, a display apparatus is provided. The display apparatus includes the display panel as described in any one of the above embodiments.

In yet another aspect, a manufacturing method of a display panel is provided. The display panel has a display region and a non-display region located on a periphery of the display region. The manufacturing method includes:

forming a first pixel driving circuit and a second pixel driving circuit synchronously on a substrate, the first pixel driving circuit being located in the display region, and the second pixel driving circuit being located in the non-display region.

The first pixel driving circuit includes first scanning signal patterns and first active patterns, the second pixel driving circuit includes second scanning signal patterns and second active patterns, and the second scanning signal patterns are coupled to the first scanning signal patterns.

An overlapping area of an orthographic projection of each of at least one first scanning signal pattern on the substrate and orthographic projections of the first active patterns on the substrate is less than an overlapping area of an orthographic projection of each of at least one second scanning signal pattern on the substrate and orthographic projections of the second active patterns on the substrate.

In some embodiments, the first scanning signal patterns and the second scanning signal patterns are synchronously formed and have the same size.

In some embodiments, the first active patterns and the second active patterns are synchronously formed, and in a length direction of the substrate, a size of at least one first active pattern is less than a size of at least one second active pattern.

In some embodiments, the manufacturing method further includes forming metal patterns on a side of the second scanning signal patterns away from the substrate. Orthographic projection of the metal patterns on the substrate overlap with orthographic projections of the second scanning signal patterns on the substrate, and the metal patterns are configured to receive voltage signals.

In yet another aspect, a manufacturing method of a display panel is provided. The display panel has a display region and a non-display region located on a periphery of the display region. The manufacturing method includes:

forming a first pixel driving circuit and a second pixel driving circuit synchronously on a substrate, the first pixel driving circuit including first scanning signal patterns and first active patterns, the second pixel driving circuit including second scanning signal patterns and second active patterns, and the second scanning signal patterns being coupled to the first scanning signal patterns; and forming metal patterns on a side of the second scanning signal patterns away from the substrate, orthographic projections of the metal patterns on the substrate overlapping with orthographic projections of the second scanning signal patterns on the substrate, and the metal patterns being configured to receive voltage signals.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1A:
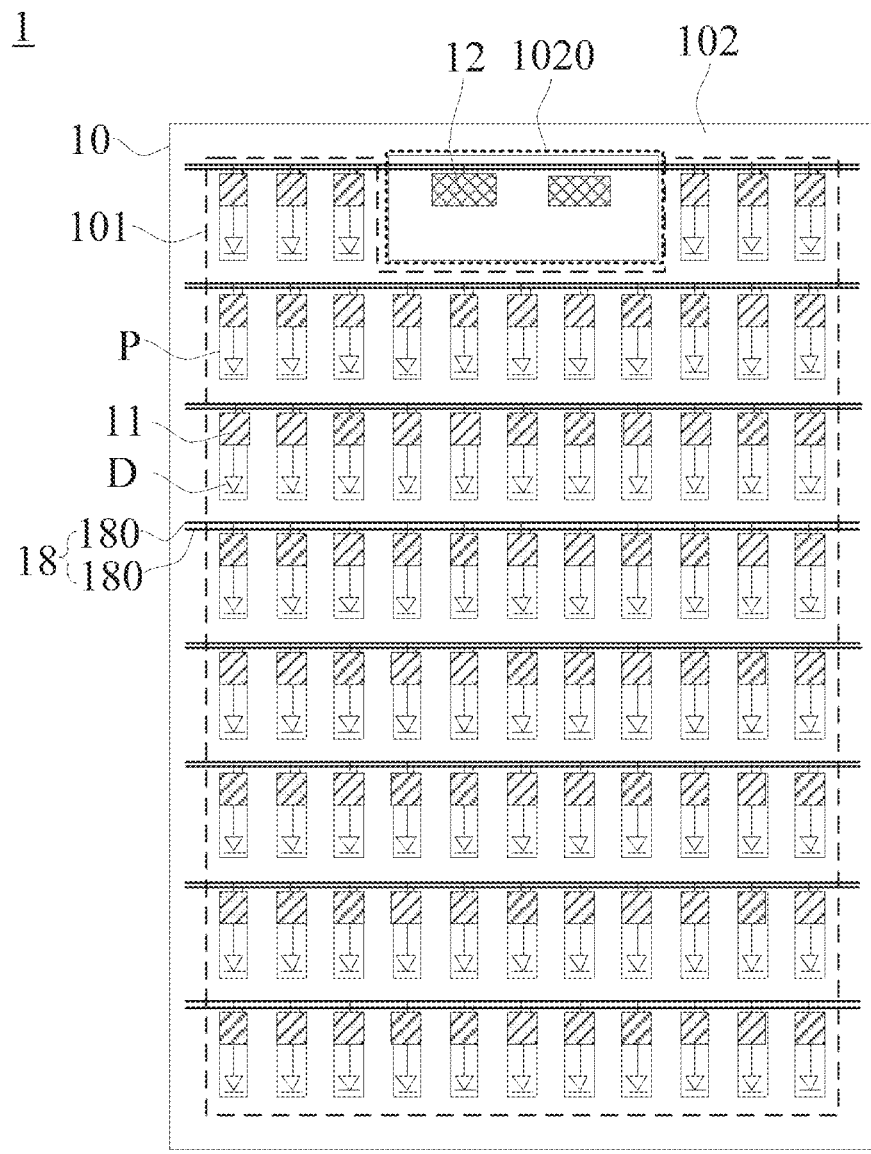
FIG. 1A is a structural diagram of a display panel, in accordance with some embodiments of the present disclosure.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, The term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if", depending on the context, is optionally construed to mean "when" or "in a case where" or "in response to determining" or "in response to detecting". Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The use of "applicable to" or "configured to" herein means an open and inclusive expression, which does not exclude devices that are applicable to or configured to perform additional tasks or steps.

Additionally, the use of "based on" is meant to be open and inclusive, since a process, step, calculation, or other action that is "based on" one or more of the stated conditions or values may, in practice, be based on additional conditions or values exceeding those stated.

As used herein, "about", "substantially" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region that is shown in a rectangular shape generally has a curved feature. Therefore, the regions shown in the accompanying drawings are schematic in nature, and their shapes are not intended to show actual shapes of regions in a device, and are not intended to limit the scope of the exemplary embodiments.

Figure 7:
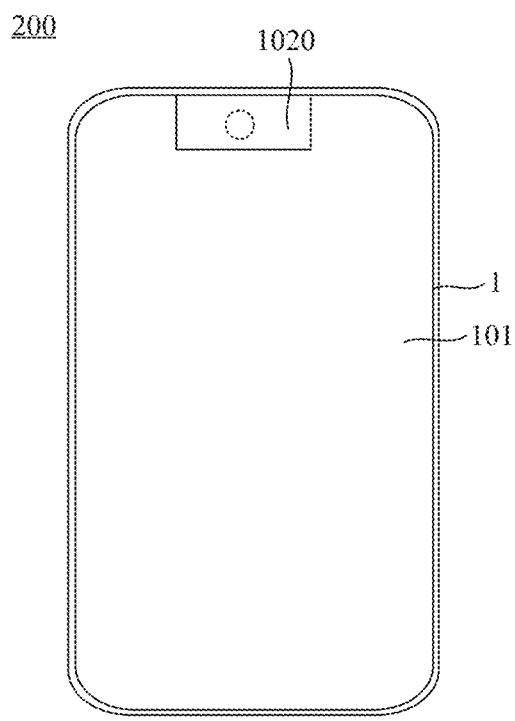
FIG. 7 is a structural diagram of a display apparatus, in accordance with some embodiments of the present disclosure.

Some embodiments of the present disclosure provide a display apparatus (e.g., a display apparatus 200 as shown in FIG. 7). The display apparatus may be, for example, any one of a liquid crystal display (LCD) apparatus, an organic light-emitting diode (OLED) display apparatus and a quantum dot light-emitting diode (QLED) display apparatus.

For example, in a case where the display apparatus is the LCD apparatus, the display apparatus may include a display panel and a backlight module. In a case where the display apparatus is the OLED display apparatus or the QLED display apparatus, the display apparatus may include a display panel.

Referring to FIG. 1A, some embodiments of the present disclosure provide the display panel 1, the display panel 1 has a display region 101 and a non-display region 102, and the display region 101 and the non-display region 102 are adjacent to each other. The display region 101 is provided with sub-pixels P of colors therein. For example, the colors are three primary colors, which are, for example, red, green and blue. A region other than the display region 101 is the non-display region 102, and the non-display region 102 includes, for example, a reserved region 1020. In a length direction of the display panel 1, regions located on two opposite sides of the reserved region 1020 belong to the display region 101. The reserved region 1020 is a region where a sensor is to be arranged, and the sensor is, for example, a front camera, a receiver, etc.

Referring to FIG. 1A, the display panel 1 includes, for example, a substrate 10, first pixel driving circuits 11 and second pixel driving circuit(s) 12.

For example, the substrate 10 is a glass substrate or a flexible substrate, and a material of the flexible substrate is, for example, polyimide (PI).

A first pixel driving circuit 11 is disposed in each sub-pixel in the display region 101; the first pixel driving circuit 11 is coupled to a light-emitting device D and is used to drive the light-emitting device D to emit light; and the light-emitting device D includes at least a light-emitting layer.

The second pixel driving circuit 12 is disposed in the non-display region 102 and is used to obtain a dummy pixel.

Therefore, the second pixel driving circuit 12 is not coupled to a light-emitting device D. That is, no light-emitting device D is disposed in the non-display region 102.

For example, the second pixel driving circuit 12 is disposed in the reserved region 1020 in the non-display region 102; in a row direction of the sub-pixels, two opposite sides of the reserved region 1020 are next to the display region 101; and in a column direction of the sub-pixels, two opposite sides of the reserved region 1020 are next to the display region 101, or only a lower side of the reserved region 1020 (e.g., a side where the number of columns of the sub-pixels is increased) is next to the display region 101.

For example, referring to FIG. 1A, a plurality of rows of pixel driving circuits are arranged in a width direction of the display panel 1, pixel driving circuits in a first row include first pixel driving circuits 11 and the second pixel driving circuit(s) 12, and pixel driving circuits in the remaining rows include only first pixel driving circuits 11.

First pixel driving circuits 11 and second pixel driving circuit(s) 12 that are located in the same row are coupled to the same scanning signal line group 18; each scanning signal line group 18 includes at least two scanning signal lines 180; and the first pixel driving circuits 11 located in the same row are coupled to the same scanning signal line group 18. That is, the first pixel driving circuits 11 and the second pixel driving circuit(s) 12 in the first row are coupled to the same scanning signal line group 18, and the first pixel driving circuits 11 in any remaining row are coupled to the same scanning signal line group 18.

On this basis, in some other embodiments, the total number of first pixel driving circuits 11 and second pixel driving circuit(s) 12 that are located in the same row is less than the number of first pixel driving circuits 11 in any other row including only the first pixel driving circuits 11. For example, the total number of the first pixel driving circuits 11 and the second pixel driving circuit(s) 12 in the first row is eight, and the number of first pixel driving circuits 11 in any remaining row is eleven.

Equivalent circuits of the first pixel driving circuit 11 and the second pixel driving circuit 12 are, for example, 7T1C pixel driving circuits. The 7T1C pixel driving circuit is a pixel driving circuit including seven thin film transistors and one storage capacitor. The first pixel driving circuit 11 includes, for example, a plurality of first thin film transistors that are coupled and a first storage capacitor, and the second pixel driving circuit 12 includes, for example, a plurality of second thin film transistors that are coupled and a second storage capacitor. In the equivalent circuits of the first pixel driving circuit 11 and the second pixel driving circuit 12, a coupling relationship between the first thin film transistors and the first capacitor is the same as a coupling relationship between the second thin film transistors and the second capacitor. For convenience of explaining the coupling relationship between devices (i.e., the thin film transistors and the storage capacitors) in the first pixel driving circuit 11 and the second pixel driving circuit 12, and the working principle of the first pixel driving circuit 11 driving the light-emitting device D to emit light, the equivalent circuit of the first pixel driving circuit 11 coupled to the light-emitting device D and the equivalent circuit of the second pixel driving circuit 12 are described below.

Figure 1B:
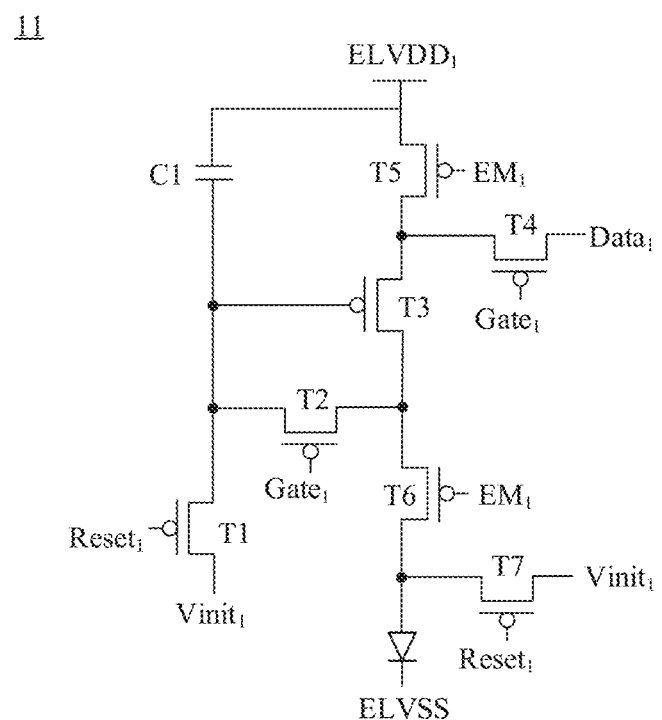
FIG. 1B is an equivalent circuit diagram of a first pixel driving circuit, in accordance with some embodiments of the present disclosure.

Referring to FIG. 1B, the first pixel driving circuit 11 includes a first thin film transistor T1, a first thin film transistor T2, a first thin film transistor T3, a first thin film transistor T4, a first thin film transistor T5, a first thin film transistor T6, a first thin film transistor T7 and a first storage capacitor C1.

A gate of the first thin film transistor T1 is coupled to a first reset signal terminal $Reset_1$, a first electrode of the first thin film transistor T1 is coupled to a first initial signal terminal $Vinit_1$, and a second electrode of the first thin film transistor T1 is coupled to an end of the first storage capacitor C1.

A gate of the first thin film transistor T2 is coupled to a first gate scanning signal terminal $Gate_1$, a first electrode of the first thin film transistor T2 is coupled to a second electrode of the first thin film transistor T3, and a second electrode of the first thin film transistor T2 is coupled to the end of the first storage capacitor C1.

A gate of the first thin film transistor T3 is coupled to the end of the first storage capacitor C1, and a first electrode of the first thin film transistor T3 is coupled to a second electrode of the first thin film transistor T4. The first thin film transistor T3 is a driving transistor.

A gate of the first thin film transistor T4 is coupled to the first gate scanning signal terminal $Gate_1$, and a first electrode of the first thin film transistor T4 is coupled to a first data signal terminal $Data_1$.

A gate of the first thin film transistor T5 is coupled to a first light-emitting control signal terminal $EM_1$, a first electrode of the first thin film transistor T5 is coupled to a first power supply voltage signal terminal $ELVDD_1$, and a second electrode of the first thin film transistor T5 is coupled to the first electrode of the first thin film transistor T3.

A gate of the first thin film transistor T6 is coupled to the first light-emitting control signal terminal $EM_1$, a first electrode of the first thin film transistor T6 is coupled to the second electrode of the first thin film transistor T3, and a second electrode of the first thin film transistor T6 is coupled to an anode of the light-emitting device D.

A gate of the first thin film transistor T7 is coupled to a first reset signal terminal $Reset_1$, a first electrode of the first thin film transistor T7 is coupled to the first initial signal terminal $Vinit_1$, and a second electrode of the first thin film transistor T7 is coupled to the anode of the light-emitting device D.

Another end of the first storage capacitor C1 is coupled to the first power supply voltage signal terminal $ELVDD_1$, and a cathode of the light-emitting device D is coupled to a cathode voltage signal terminal ELVSS.

In a case where the first pixel driving circuit 11 is located in an nth row of sub-pixels, n being a positive integer and greater than 1, a reset signal $Reset_1[n-1]$ is provided by the first reset signal terminal $Reset_1$ coupled to the first thin film transistor T1, and the reset signal $Reset_1[n-1]$ is the same as a gate scanning signal $Gate_1[n-1]$ provided by a first gate scanning signal terminal $Gate_1$ in an (n−1)th row; and a reset signal (i.e., a first reset signal) $Reset_1[n]$ is provided by the first reset signal terminal $Reset_1$ coupled to the first thin film transistor T7, and the reset signal $Reset_1[n]$ is the same as a gate scanning signal (i.e., a first gate scanning signal) $Gate_1[n]$ provided by a first gate scanning signal terminal $Gate_1$ in an nth row. Therefore, in a case where each scanning signal line group 18 includes two scanning signal lines 180 connected in parallel, one scanning signal line 180 is used to provide a gate scanning signal to the first pixel driving circuit 11, and the other scanning signal line 180 is used to provide a reset signal to the first pixel driving circuit 11. For example, in a scanning signal line group 18 located in the (n−1)th row, one scanning signal line 180 is used to provide the gate scanning signal $Gate_1[n-1]$, and the other scanning signal line 180 is used to provide the reset signal $Reset_1[n-1]$. For another example, in a scanning signal line group 18 located in the nth row, one scanning signal line 180 is used to provide the gate scanning signal Gate₁[n], the other scanning signal line 180 is used to provide the reset signal Reset₁[n]. The first thin film transistor T1 in the first pixel driving circuit 11 located in the nth row is coupled to the scanning signal line 180 in the (n−1)th row that is used to provide the reset signal Reset₁[n−1].

The first thin film transistors T1 to T7 are, for example, all P-type transistors or all N-type thin film transistors. In the embodiments of the present disclosure, the first thin film transistors T1 to T7 are all the P-type transistors as an example for illustration.

Based on the coupling relationship between the first pixel driving circuit 11 and the light-emitting device D mentioned above, a working process of the first pixel driving circuit 11 driving the light-emitting device D to emit light is described below.

In a reset phase, the first thin film transistor T1 is turned on under control of the reset signal Reset₁[n−1] provided by the first reset signal terminal Reset₁, and transmits an initial signal provided by the first initial signal terminal Vinit₁ to the end of the first storage capacitor C1, so as to reset the end of the first storage capacitor C1 and the gate of the first thin film transistor T3.

In a data writing phase, the first thin film transistor T7 is turned on under control of the reset signal Reset₁[n] provided by the first reset signal terminal Reset₁, and transmits the initial signal provided by the first initial signal terminal Vinit₁ to the anode of the light-emitting device D, so as to reset the anode of the light-emitting device D. The first thin film transistor T2 and the first thin film transistor T4 are both turned on under control of the gate scanning signal Gate₁[n] provided by the first gate scanning signal terminal Gate₁[n], and a data signal provided by the first data signal terminal Data₁ is transmitted to the gate of the first thin film transistor T3 and the end of the first storage capacitor C1 through the first thin film transistor T4, the first thin film transistor T3 and the first thin film transistor T2, so that the first thin film transistor T3 is turned on, and the first storage capacitor C1 is charged. The gate scanning signal Gate₁[n] and the rest signal Reset₁[n] are the same, and thus may be provided by one scanning signal line 180 or by two scanning signal lines 180 connected in parallel. In a case where the gate scanning signal Gate₁[n] and the reset signal Reset₁[n] are provided by two scanning signal lines 180, the two scanning signal lines 180 need to be coupled to the same output terminal of a gate driving circuit. The gate driving circuit is configured to provide scanning signals to scanning signal lines 180, and a scanning signal may serve as a gate scanning signal or a reset signal.

In a light-emitting phase, the first storage capacitor C1 starts discharging, the first thin film transistor T3 is kept to be turned on. The first thin film transistor T5 and the first thin film transistor T6 are turned on under control of a light-emitting control signal EM₁[n] provided by the first light-emitting control signal terminal EM₁. Therefore, a power supply voltage signal provided by the first power supply voltage signal terminal ELVDD₁ is transmitted to the first electrode of the first thin film transistor T3 through the first thin film transistor T5, and an output signal of the second electrode of the first thin film transistor T3 is transmitted to the anode of the light-emitting device D through the first thin film transistor T6, so as to drive the light-emitting device D to emit light.

Figure 1C:
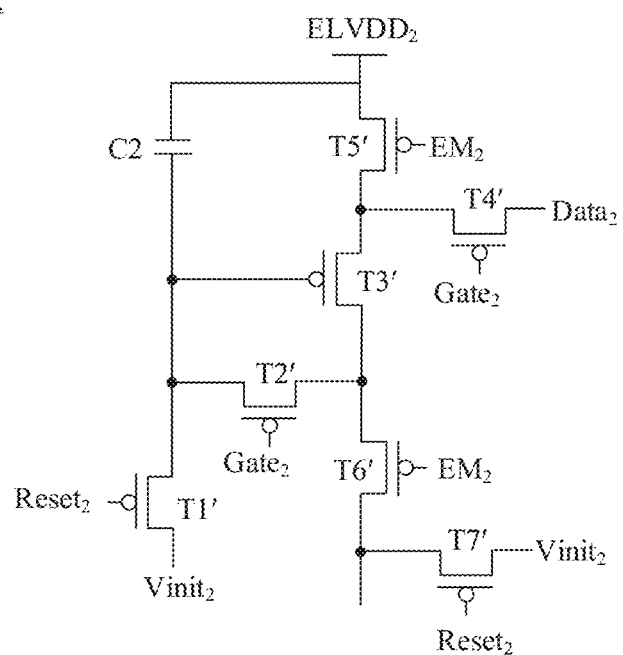
FIG. 1C is an equivalent circuit diagram of a second pixel driving circuit, in accordance with some embodiments of the present disclosure.

FIG. 1C is an equivalent circuit diagram of the second pixel driving circuit 12, and referring to FIG. 1C, the second pixel driving circuit 12 includes a second thin film transistor T1', a second thin film transistor T2', a second thin film transistor T3', a second thin film transistor T4', a second thin film transistor T5', a second thin film transistor T6, a second thin film transistor T7' and a second storage capacitor C2.

A gate of the second thin film transistor T1 is coupled to a second reset signal terminal Reset₂, a first electrode of the second thin film transistor T1' is coupled to a second initial signal terminal Vinit₂, and a second electrode of the second thin film transistor T' is coupled to an end of the second storage capacitor C2.

A gate of the second thin film transistor T2' is coupled to a second gate scanning signal terminal Gate₂, a first electrode of the second thin film transistor T2' is coupled to a second electrode of the second thin film transistor T3', and a second electrode of the second thin film transistor T2' is coupled to the end of the second storage capacitor C2.

A gate of the second thin film transistor T3' is coupled to the end of the second storage capacitor C2, and a first electrode of the second thin film transistor T3' is coupled to a second electrode of the second thin film transistor T4'. The second thin film transistor T3' is a driving transistor.

A gate of the second thin film transistor T4' is coupled to the second gate scanning signal terminal Gate₂, and a first electrode of the second thin film transistor T4' is coupled to a second data signal terminal Data₂.

A gate of the second thin film transistor T5' is coupled to a second light-emitting control signal terminal EM₂, a first electrode of the second thin film transistor T5' is coupled to a second power supply voltage signal terminal ELVDD₂, and a second electrode of the second thin film transistor T5' is coupled to the first electrode of the second thin film transistor T3'.

A gate of the second thin film transistor T6' is coupled to the second light-emitting control signal terminal EM₂, a first electrode of the second thin film transistor T6' is coupled to the second electrode of the second thin film transistor T3, and a second electrode of the second thin film transistor T6' is coupled to a second electrode of the second thin film transistor T7'.

A gate of the second thin film transistor T7' is coupled to a second reset signal terminal Reset₂, a first electrode of the second thin film transistor T7' is coupled to the second initial signal terminal Vinit₂.

Another end of the second storage capacitor C2 is coupled to the second power supply voltage signal terminal ELVDD₂.

In a case where the second pixel driving circuit 12 is located in the nth row of sub-pixels, n being the positive integer and greater than 1, a reset signal Reset₂[n−1] is provided by the second reset signal terminal Reset₂ coupled to the second thin film transistor T1', and the reset signal Reset₂[n−1] is the same as a gate scanning signal Gate₂[n−1] provided by a second gate scanning signal terminal Gate₂ in the (n−1)th row; and a reset signal (i.e., a second reset signal) Reset₂[n] is provided by the second reset signal terminal Reset₂ coupled to the second thin film transistor T7', and the reset signal Reset₂[n] is the same as a gate scanning signal (i.e., a second gate scanning signal) Gate₂[n] provided by a second gate scanning signal terminal Gate₂ in the nth row. Therefore, in a case where each scanning signal line group 18 includes two scanning signal lines 180, in the scanning signal line group 18 located in the nth row, one scanning signal line 180 is used to provide the gate scanning signal Gate₂[n] to the second pixel driving circuit 12, the other scanning signal line 180 is used to provide the reset signal Reset₂[n] to the second pixel driving circuit 12. The second thin film transistor TV is coupled to the scanning signal line 180 in the scanning signal line group 18 located in the (n−1)th row that is used to provide the reset signal Reset$_2$[n−1].

Since the second pixel driving circuit 12 is not coupled to the light-emitting device D, a working process of the second pixel driving circuit 12 includes a reset phase and a data writing phase, and the reset phase and the data writing phase are the same as those of the first pixel driving circuit 11 and details will not be repeated here.

Although the equivalent circuit diagrams of the first pixel driving circuit 11 and the second pixel driving circuit 12 are the same, specific structures of the first thin film transistors in the first pixel driving circuit 11 and the second thin film transistors in the second pixel driving circuit 12 are not completely the same.

Figure 2A:
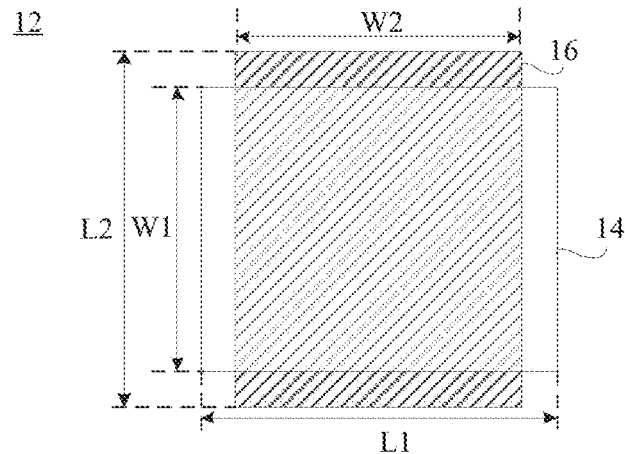
FIG. 2A is a schematic diagram showing an overlapping area of a second scanning signal pattern and a second active pattern, in accordance with some embodiments of the present disclosure.
Figure 2B:
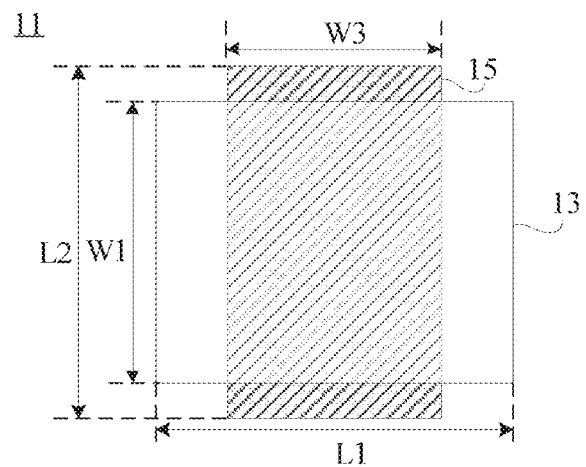
FIGS. 2B to 2D are structural diagrams of first scanning signal patterns and first active patterns, in accordance with some embodiments of the present disclosure.

Based on the equivalent circuit diagram of the first pixel driving circuit 11, referring to FIG. 2B, the first pixel driving circuit 11 includes, for example, first scanning signal patterns 13 and first active patterns 15.

For example, each first thin film transistor in the first pixel driving circuit 11 includes a first scanning signal pattern 13 and a first active pattern 15. For example, the first scanning signal pattern 13 is used as a gate of the first thin film transistor, and the first active pattern 15 is used as an active layer of the first thin film transistor.

Based on the equivalent circuit diagram of the second pixel driving circuit 12, referring to FIG. 2A, the second pixel driving circuit 12 includes, for example, second scanning signal patterns 14 and second active patterns 16.

For example, each second thin film transistor in the second pixel driving circuit 12 includes a second scanning signal pattern 14 and a second active pattern 16. For example, the second scanning signal pattern 14 is used as a gate of the second thin film transistor, and the second active pattern 16 is used as an active layer of the second thin film transistor.

The first scanning signal pattern 13 is coupled to the second scanning signal pattern 14. For example, first scanning signal patterns 13 and second scanning signal patterns 14 are coupled to the same scanning signal line 180.

In some other embodiments, a portion of the same scanning signal line 180 is used as the first scanning signal pattern 13, and another portion thereof is used as the second scanning signal pattern 14.

For example, the first scanning signal pattern 13 and the second scanning signal pattern 14 are made of the same material. For example, the first scanning signal pattern 13 and the second scanning signal pattern 14 are made of metal. For example, the metal is one of conductive metals such as silver (Ag) and aluminum (Al). For example, the first active pattern 15 and the second active pattern 16 are made of the same material, for example, one of semiconductor materials such as amorphous silicon (a-si) and polycrystalline silicon (p-si).

Referring to FIGS. 2A to 2D, an overlapping area of an orthographic projection of each of at least one first scanning signal pattern 13 on the substrate 10 and orthographic projections of the first active patterns 15 on the substrate 10 is less than an overlapping area of an orthographic projection of each of at least one second scanning signal pattern 14 on the substrate 10 and orthographic projections of the second active patterns 16 on the substrate 10.

For example, an overlapping area of an orthographic projection of each second scanning signal pattern 14 of at least part of the second scanning signal patterns 14 of the second pixel driving circuit 12 on the substrate 10 and an orthographic projection of a corresponding second active pattern 16 on the substrate 10 is greater than an overlapping area of an orthographic projection of any first scanning signal pattern 13 of the first pixel driving circuit 11 on the substrate 10 and an orthographic projection of a first active pattern 15 on the substrate 10. An overlapping area of an orthographic projection of each second scanning signal pattern 14 of the remaining part of the second scanning signal patterns 14 of the second pixel driving circuit 12 on the substrate 10 and an orthographic projection of a corresponding second active pattern 16 on the substrate 10 is, for example, approximately equal to the overlapping area of the orthographic projection of the first scanning signal pattern 13 on the substrate 10 and the orthographic projection of the first active pattern 15 on the substrate 10.

For example, referring to FIGS. 2A and 2B, a size of the second scanning signal pattern 14 and a size of the first scanning signal pattern 13 are the same or approximately the same, an area of the second scanning signal pattern 14 and an area of the first scanning signal pattern 13 are the same or approximately the same, and an area of the second active pattern 16 is greater than an area of the first active pattern 15. For example, the first scanning signal pattern 13 and the second scanning signal pattern 14 each have a length of L1 and a width of W1; the first active pattern 15 and the second active pattern 16 each have a length of L2; and the second active pattern 16 has a width of W2, the first active pattern 15 has a width of W3, and W3 is less than W2.

Figure 2C:
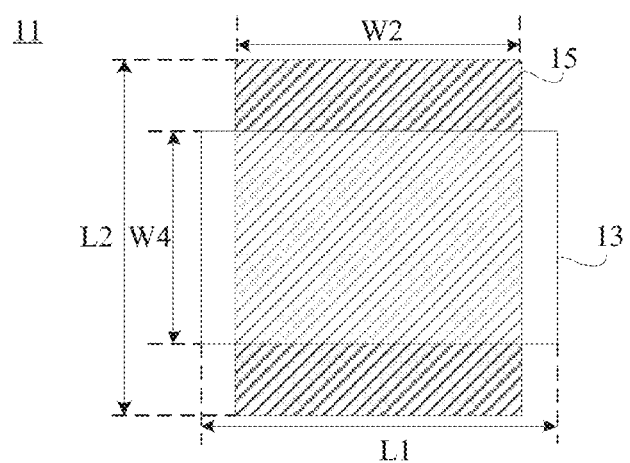

In some other embodiments, referring to FIGS. 2A and 2C, the area of the first scanning signal pattern 13 is less than the area of the second scanning signal pattern 14, and the area of the first active pattern 15 and the area of the second active pattern 16 are the same or approximately the same. For example, the first scanning signal pattern 13 and the second scanning signal pattern 14 each have the length of L1, the second scanning signal pattern 14 has the width of W1, the first scanning signal pattern 13 has a width of W4, and W4 is less than W3. The first active pattern 15 and the second active pattern 16 each have the length of L2 and the width of W2.

Figure 2D:
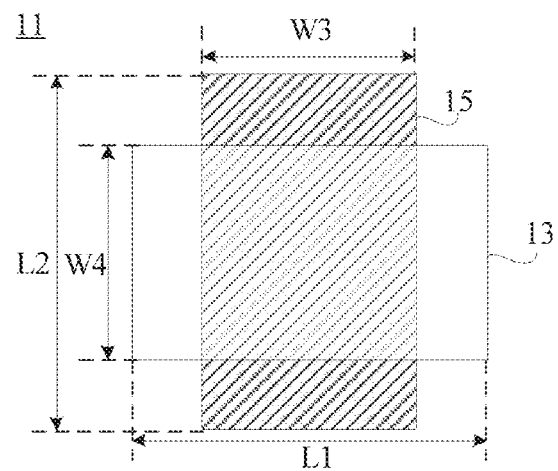

In still some other embodiments, referring to FIGS. 2A and 2D, the area of the first scanning signal pattern 13 is less than the area of the second scanning signal pattern 14, and the area of the first active pattern 15 is less than the area of the second active pattern 16. For example, the first scanning signal pattern 13 and the second scanning signal pattern 14 each have the length of L1, the second scanning signal pattern 14 has the width of W1, the first scanning signal pattern 13 has the width of W4, and W4 is less than W1. The first active pattern 15 and the second active pattern 16 each have the length of L2, the second active pattern 16 has the width of W2, the first active pattern 15 has the width of W3, and W3 is less than W2.

When the first pixel driving circuit 11 and the second pixel driving circuit 12 work, a first channel capacitance may be created between the first scanning signal pattern 13 and the first active pattern 15, and a second channel capacitance may be created between the second scanning signal pattern 14 and the second active pattern 16. In a case where the overlapping area of the orthographic projection of the first scanning signal pattern 13 on the substrate 10 and the orthographic projection of the first active pattern on the substrate 10 is less than the overlapping area of the orthographic projection of the second scanning signal pattern 14 on the substrate 10 and the orthographic projection of the second active pattern 16 on the substrate 10, the first channel capacitance is less than the second channel capacitance.

Figure 3A:
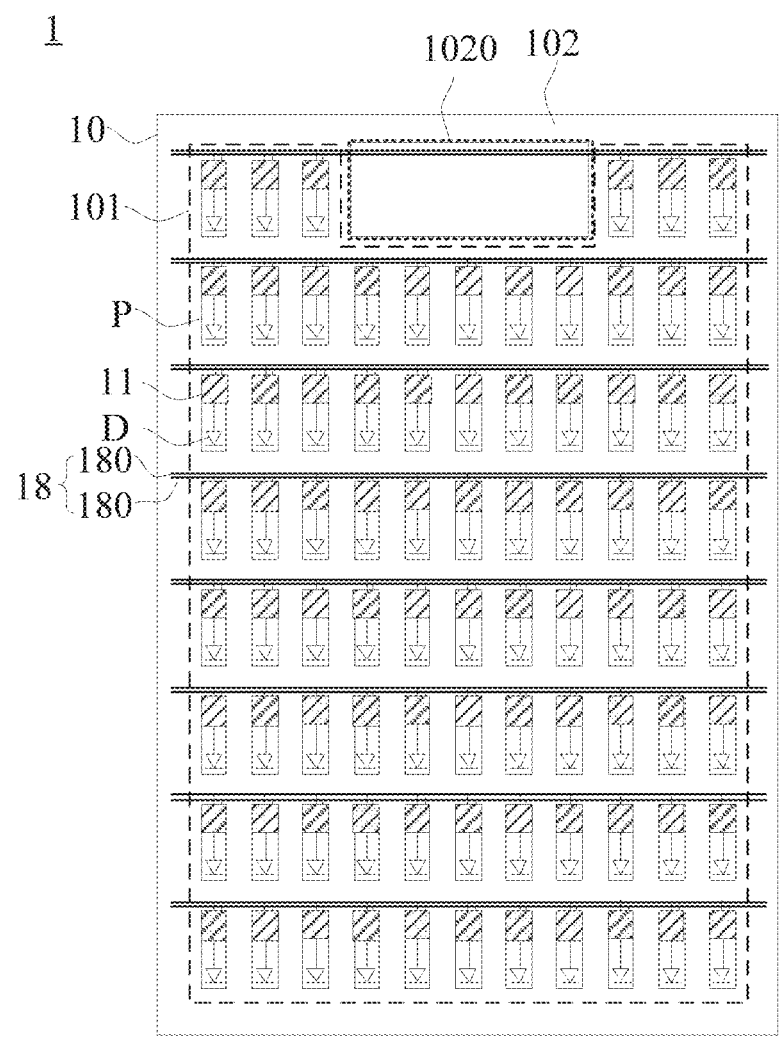
FIG. 3A is a structural diagram of a display panel in the related art.
Figure 3B:
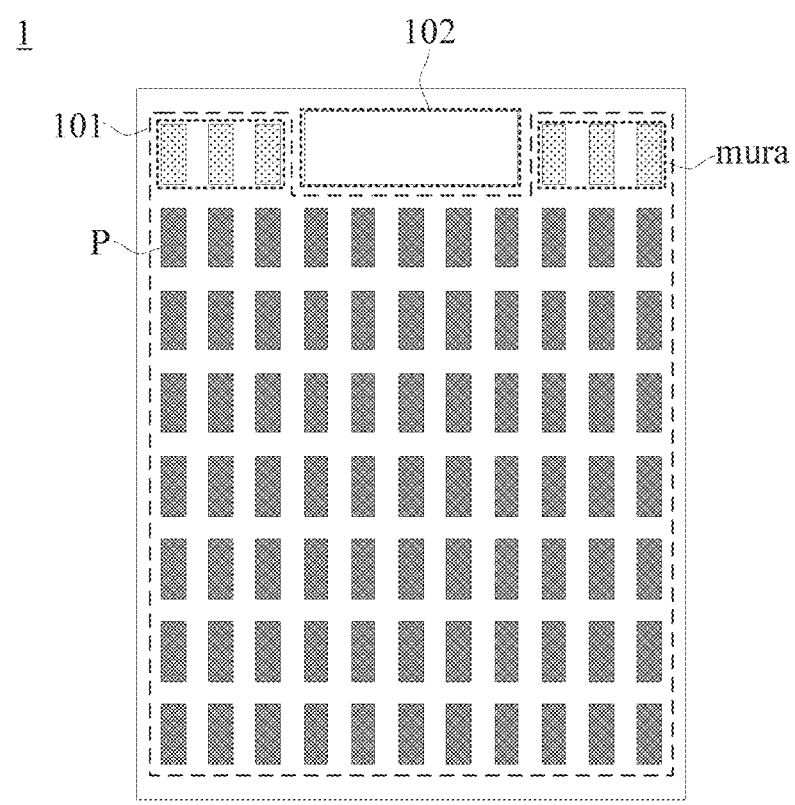
FIG. 3B is a diagram showing a display effect of a display panel in the related art.

Referring to FIG. 3A, in the related art, a display panel 1 has a display region 101 and a non-display region 102, a region of the display panel 1 other than the display region 101 is the non-display region 102, and the non-display region 102 includes, for example, a reserved region 1020. The display region 101 is provided with sub-pixels P of colors disposed on a substrate 10, each sub-pixel P is provided with a first pixel driving circuit 11 and a light-emitting device D, and regions of the display region 101 located on two opposite sides of the reserved region 1020 in a row direction of the sub-pixels P are also provided with first pixel driving circuits 11 and light-emitting devices D. In the display panel 1, the first pixel driving circuits 11 located in the same row are coupled to the same scanning signal line group 18; and each scanning signal line group 18 includes, for example, two scanning signal lines 180. The first pixel driving circuits 11 located on the two opposite sides of the reserved region 1020 need to be turned on at the same time, so that part of the scanning signal line groups 18 may pass through the reserved region 1020 to ensure the normal working of the first pixel driving circuits 11 in the row coupled to the scanning signal line group 18 passing through the reserved region 1020. Since there is no first pixel driving circuit 11 in the reserved region 1020, in the row direction of the sub-pixels P, the number of first pixel driving circuits 11 coupled to a scanning signal line 180 passing through the reserved region 1020 is different from the number of first pixel driving circuits 11 coupled to a scanning signal line 180 not passing through the reserved region 1020. For example, a first scanning signal line group 18 passes through the reserved region 1020, and the number (e.g., six) of first pixel driving circuits 11 coupled to a first scanning signal line 180 and a second scanning signal line 180 is less than the number (e.g., eleven) of first pixel driving circuits 11 coupled to the other scanning signal lines 180 not passing through the reserved region 1020. For one scanning signal line 180, each first pixel driving circuit 11 coupled thereto is equivalent to a load. Thus, as shown in FIG. 3A, a total load on any of two scanning signal lines 180 in the first scanning signal line group 18 coupled to first pixel driving circuits 11 in a first row is less than a total load on any scanning signal line 180 in any scanning signal line group 18 other than the first scanning signal line group 18. Since a total load on each scanning signal line 180 in the first scanning signal line group 18 is different from a total load on each scanning signal line 180 in any other scanning signal line group 18, a scanning signal received by the first pixel driving circuit 11 coupled to the first scanning signal line group 18 is greater than a scanning signal received by the first pixel driving circuit 11 coupled to any other scanning signal line group 18. Therefore, a current signal output to the light-emitting device D by the first pixel driving circuit 11 coupled to the first scanning signal line group 18 is less than a current signal output to the light-emitting device D by the first pixel driving circuit 11 coupled to any other scanning signal line group 18. As a result, during the display of the display panel 1, if any of the sub-pixels P in the first row has the same theoretical display brightness as any of sub-pixels P in any other row, an actual display brightness of the sub-pixel P in the first row is less than an actual display brightness of the sub-pixel P in any other row. For example, referring to a display effect of the display panel 1 when displaying a single color image shown in FIG. 3B, although the sub-pixel P in the first row has the same or approximately the same theoretical display brightness as the sub-pixel P in any other row, in an actual display image, an actual display brightness of each sub-pixel P in the first row is less than an actual display brightness of each sub-pixel P in any other row, resulting in the mura phenomenon. That is, there is a region that differs in display brightness from other regions. Therefore, in the display panel 1, the load on the scanning signal line 180 in the scanning signal line group 18 passing through the reserved region 1020 and the total load on the scanning signal line 180 in the scanning signal line group 18 not passing through the reserved region 1020 are different and have a large difference, resulting in the mura phenomenon of the display panel 1.

Referring to FIG. 1A, a scanning signal line group 18 in the first row is coupled to the first pixel driving circuit 11 and the second pixel driving circuit 12, and scanning signal line groups 18 in other rows are only coupled to the first pixel driving circuits 11. Since the sensor needs to be provided in the reserved region 1020, only part of the reserved region 1020 may be used to provide the second pixel driving circuit 12. Therefore, the number of first pixel driving circuits 11 disposed in a portion of the display region 101 having the same area as the reserved region 1020 is greater than the number of second pixel driving circuits 12 disposed in the reserved region 1020. For example, referring to FIG. 1A, only two second pixel driving circuits 12 are disposed in the reserved region 1020, and five first pixel driving circuits 11 are disposed in the portion of the display region having the same area as the reserved region 1020. Therefore, even if the scanning signal line group 18 in the first row is coupled to the first pixel driving circuit 11 and the second pixel driving circuit 12, the total number (e.g., eight) of first pixel driving circuits 11 and second pixel driving circuits 12 in the row is less than the number (e.g., eleven) of first pixel driving circuits 11 in any other row. If it is necessary to make the total load on each scanning signal line 180 in the scanning signal line group 18 in the first row equal to or approximately equal to the total load on any one scanning signal line 180 in the scanning signal line groups 18 in other rows, a load provided by the second pixel driving circuit 12 must be greater than a load provided by the first pixel driving circuit 11.

Therefore, in the embodiments of the present disclosure, the reserved region 1020 in the non-display region 102 is provided with the second pixel driving circuit 12, and in the second pixel driving circuit 12, the overlapping area of the orthographic projection of the second scanning signal pattern 14 on the substrate 10 and the orthographic projection of the second active pattern 16 on the substrate 10 is greater than the overlapping area of the orthographic projection of the at least one first scanning signal pattern 13 on the substrate 10 and the orthographic projection of the first active pattern 15 on the substrate 10, which causes the second channel capacitance to be greater than the first channel capacitance. In a case where the second channel capacitance is greater than the first channel capacitance, the load provided by the second pixel driving circuit 12 is greater than the load provided by the first pixel driving circuit 11. In this way, in the embodiments of the present disclosure, the total load on each scanning signal line 180 that needs to pass through the reserved region 1020 to connect the first pixel driving circuits 11 located on the two opposite sides of the reserved region 1020 may be equal to or approximately equal to the total load on each scanning signal line 180 in the scanning signal line group 18 not passing through the reserved region 1020, so that the total loads on all scanning signal lines 180 in the display panel 1 are the same or approximately the same. The second pixel driving circuit 12 compensates for the total load on the scanning signal line 180. When the total loads on all scanning signal lines 180 in the display panel 1 are the same or approximately the same, if sub-pixels corresponding to the scanning signal line 180 passing through the reserved region 1020 and sub-pixels corresponding to the scanning signal line 180 not passing through the reserved region 1020 have the same theoretical display brightness, the actual display brightness thereof are the same or approximately the same, so that the mura phenomenon is eliminated, and the display effect of the display panel 1 is improved.

A signal received by the second pixel driving circuit 12 is provided by the scanning signal line 180, and the second pixel driving circuit 12 plays a role of compensation, so that the total loads on different scanning signal lines 180 are approximately the same. The scanning signal received by the scanning signal line 180 is provided by the gate driving circuit, and the gate driving circuit has the same capability of outputting a scanning signal to each scanning signal line 180. In a case where the total loads on two scanning signal lines 180 are different, magnitudes of actual scanning signals respectively output to the two scanning signal lines 180 by the gate driving circuit are different. Therefore, the compensation for the total load on the scanning signal line 180 by the second pixel driving circuit 12 may also be understood as the compensation for the total load on the scanning signal output by the gate driving circuit.

In some embodiments, referring to FIGS. 2A and 2B, the first scanning signal patterns 13 and the second scanning signal patterns 14 have a same size. The size may be understood as, for example, a length and a width.

In a case where the size of the first scanning signal pattern 13 and the size of the second scanning signal pattern 14 are the same, the area of the first scanning signal pattern 13 and the area of the second scanning signal pattern 14 are the same.

For example, the first scanning signal pattern 13 and the second scanning signal pattern 14 each have the length of L1 and the width of W1.

In the case where the size of the first scanning signal pattern 13 and the size of the second scanning signal pattern 14 are the same, if the area of the first active pattern 15 is less than the area of the second active pattern 16, the first channel capacitance may be less than the second channel capacitance. The area of the first active pattern 15 being less than the area of the second active pattern 16 includes the following situations: a length of the first active pattern 15 and a length of the second active pattern 16 are the same or approximately the same, and a width of the first active pattern 15 is less than a width of the second active pattern 16; or the width of the first active pattern 15 and the width of the second active pattern 16 are the same or approximately the same, and the length of the first active pattern 15 is less than the length of the second active pattern 16; or the length and the width of the first active pattern 15 are less than the length and the width of the second active pattern 16, respectively.

Since the first scanning signal pattern 13 is coupled to the second scanning signal pattern 14, in the case where the size of the first scanning signal pattern 13 and the size of the second scanning signal pattern 14 are the same, it is conducive to fabricating the first scanning signal pattern 13 and the second scanning signal pattern 14 simultaneously. In a case where a portion of the scanning signal line 180 serves as a first scanning signal pattern and a remaining portion thereof serves as a second scanning signal pattern 14, the size of the first scanning signal pattern 13 and the size of the second scanning signal pattern 14 are the same, so that widths corresponding to different lengths of the scanning signal line 180 are approximately the same, and an aesthetic of the scanning signal line 180 is good.

On this basis, in some other embodiments, referring to FIGS. 2A and 2B, in a length direction of the first scanning signal pattern 13, a size of at least one first active pattern 15 is less than a size of at least one second active pattern 16.

The length direction of the first scanning signal pattern 13 is same as a width direction of the first active pattern 15 or the second active pattern 16. The length direction of the first scanning signal pattern 13 may be a length direction of the substrate 10, and the length direction of the substrate 10 may be the length direction of the display panel 1. For example, the first active pattern 15 has the width of W3, the second active pattern 16 has the width of W2, and W3 is less than W2.

Since the area of the first active pattern 15 is less than the area of the second active pattern 16, the first channel capacitance is less than the second channel capacitance.

Figure 4A:
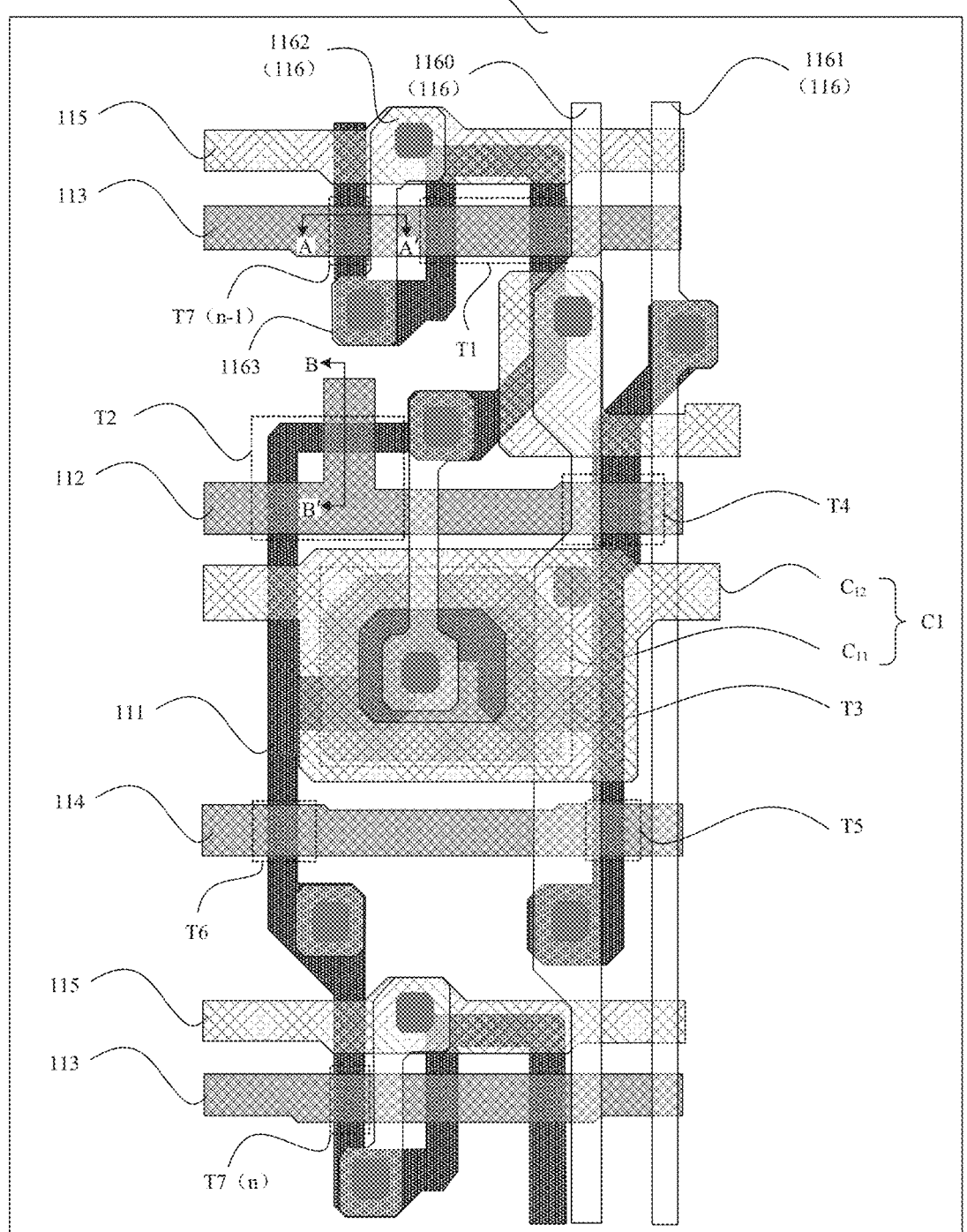
FIG. 4A is a layout diagram of a first pixel driving circuit, in accordance with some embodiments of the present disclosure.
Figure 4B:
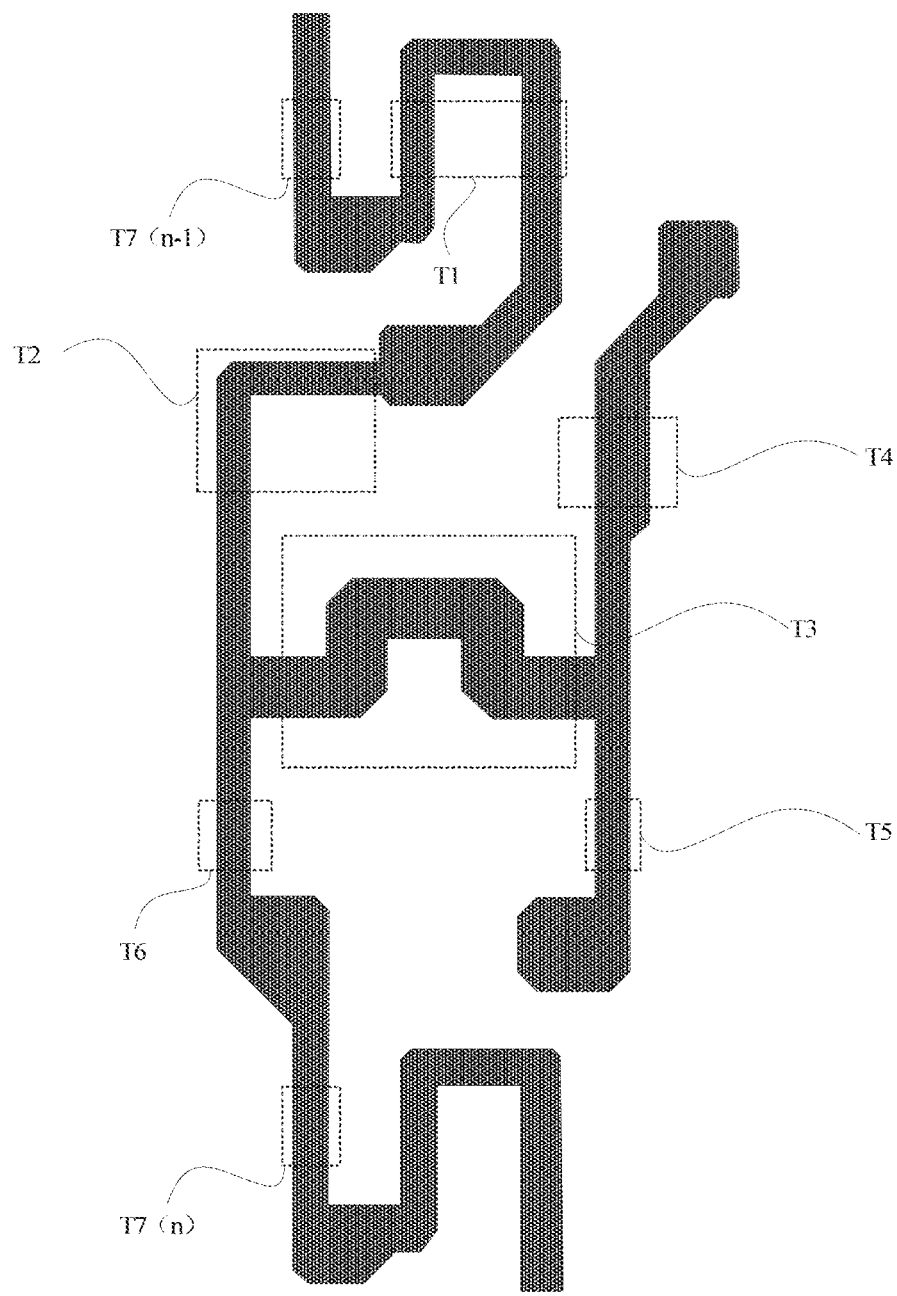
FIG. 4B is a structural diagram of a first semiconductor layer, in accordance with some embodiments of the present disclosure.
Figure 5A:
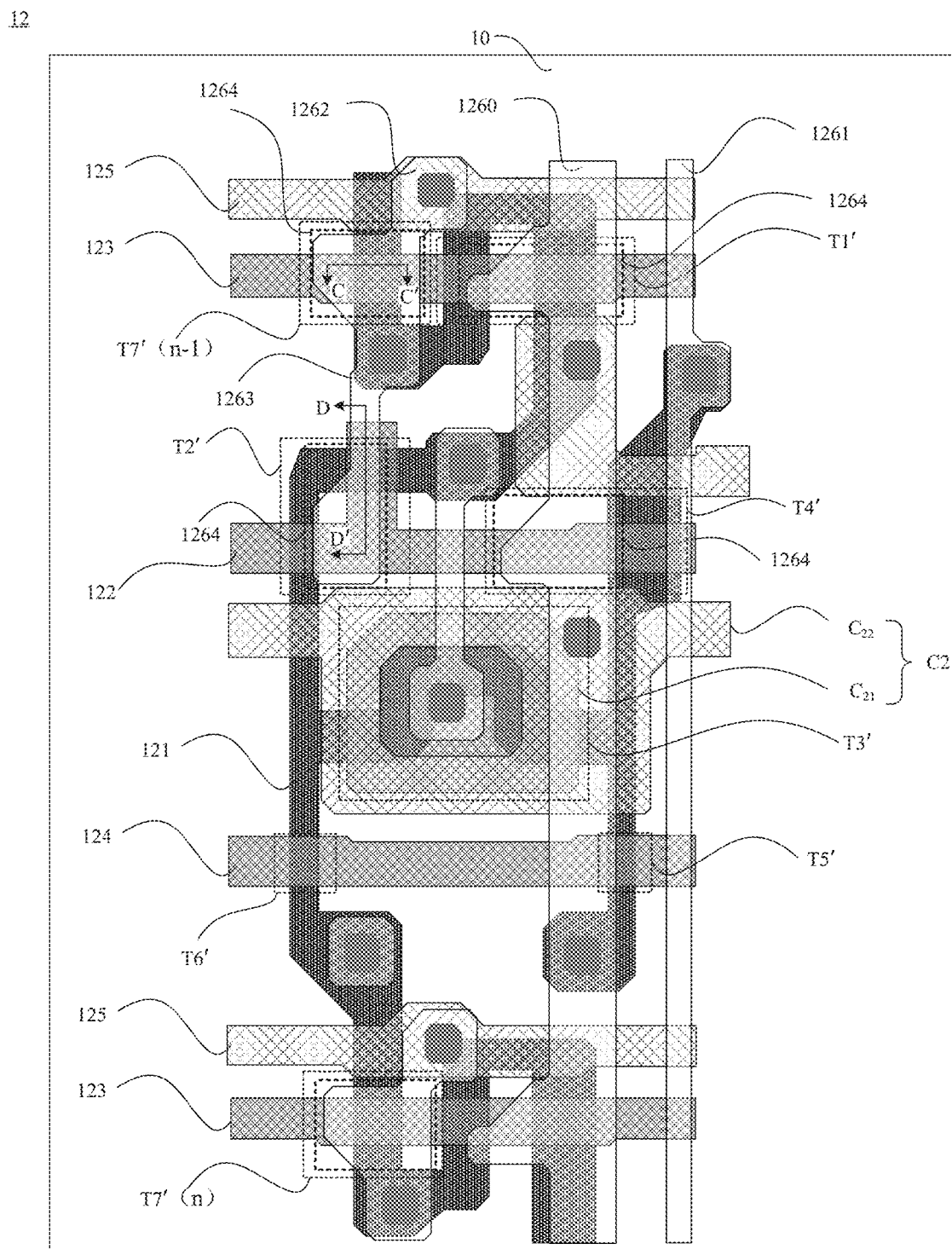
FIG. 5A is a layout diagram of a second pixel driving circuit, in accordance with some embodiments of the present disclosure.
Figure 5B:
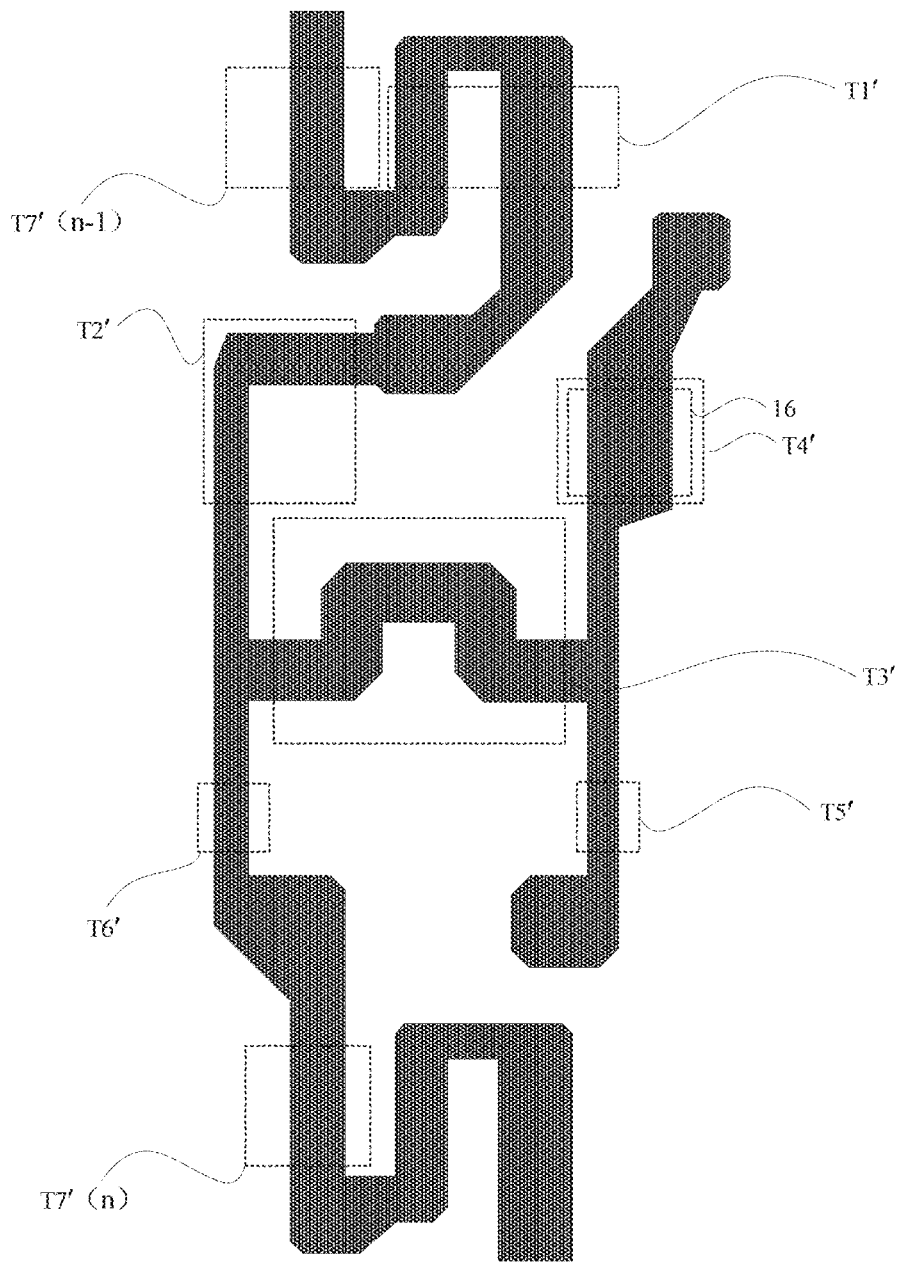
FIG. 5B is a structural diagram of a second semiconductor layer, in accordance with some embodiments of the present disclosure.

Referring to FIGS. 4A and 4B, in the first pixel driving circuit 11, all first active patterns 15 are coupled together to constitute a first semiconductor layer 111, and a portion of the first semiconductor layer 111 at a position where each first thin film transistor is located is a first active pattern 15. Referring to FIGS. 5A and 5B, in the second pixel driving circuit 12, all second active patterns 16 are coupled together to constitute a second semiconductor layer 121, and a portion of the second semiconductor layer 121 at a position where each second thin film transistor is located is a second active pattern 16. Therefore, in the embodiments of the present disclosure, in a case where a width of a part of the first active patterns 15 are set to be less than the width of the second active pattern 16, only widths of portions of the first semiconductor layer 111 or the second semiconductor layer 121 needs to be adjusted, and the manufacturing process is simple.

Figure 4C:
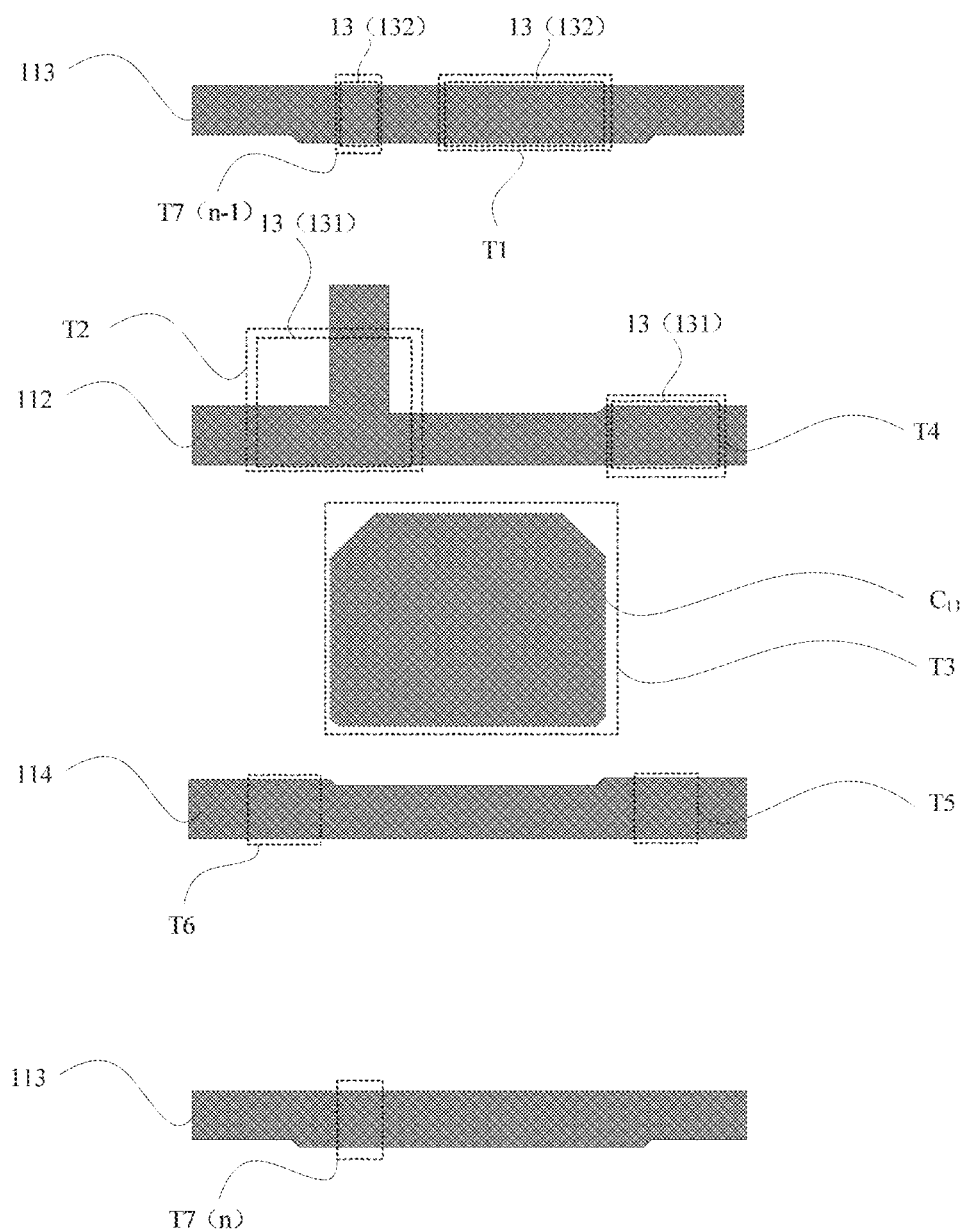
FIG. 4C is a structural diagram of a first gate metal layer, in accordance with some embodiments of the present disclosure.

In some embodiments, referring to FIG. 4C, the first scanning signal patterns 13 include first gate scanning signal patterns 131 and/or first reset signal patterns 132.

The first scanning signal patterns 13 may all be first gate scanning signal patterns 131; or the first scanning signal patterns 13 may all be first reset signal patterns 132; or part of the first scanning signal patterns 13 may be first gate scanning signal patterns 131, and the remaining part thereof may be first reset signal patterns 132. First gate scanning signal patterns 131 located in the same row are coupled together, and first reset signal patterns 132 located in the same row are coupled together.

A first gate scanning signal pattern 131 is configured to provide the gate scanning signal $Gate_1[n]$ to the first gate scanning signal terminal $Gate_1$. First reset signal patterns 132 are configured to provide reset signals to first reset signal terminals $Reset_1$, and the reset signals include, for example, the reset signal $Reset_1[n]$ and the reset signal $Reset_1[n-1]$.

Referring to FIG. 1B, the first thin film transistor T2 and the first thin film transistor T4 are coupled to the first gate scanning signal terminal $Gate_1$, and the first thin film transistor T1 and the first thin film transistor T7 are coupled to the first reset signal terminals $Reset_1$.

Therefore, referring to FIG. 4C, in the first pixel driving circuit 11, first thin film transistors including first gate scanning signal patterns 131 include, for example, the first thin film transistor T2 and the first thin film transistor T4; and first thin film transistors including first reset signal patterns 132 include, for example, the first thin film transistor T1 and the first thin film transistor T7.

Figure 5C:
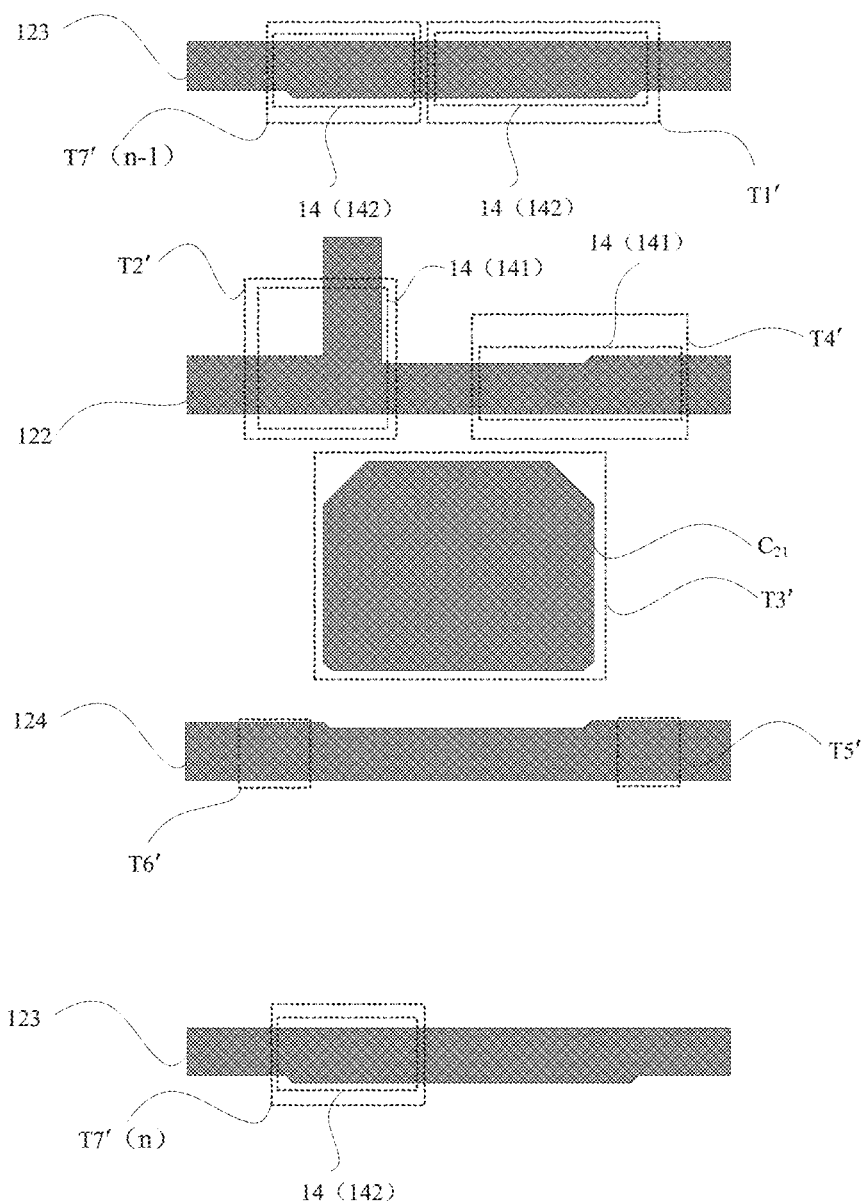
FIG. 5C is a structural diagram of a second gate metal layer, in accordance with some embodiments of the present disclosure.

Referring to FIG. 5C, the second scanning signal patterns 14 include second gate scanning signal patterns 141 and/or second reset signal patterns 142.

The second scanning signal patterns 14 may all be second gate scanning signal patterns 141; or the second scanning signal patterns 14 may all be second reset signal patterns 142; or part of the second scanning signal patterns 14 may be second gate scanning signal patterns 141, and the remaining part thereof may be second reset signal patterns 142. Second gate scanning signal patterns 141 located in the same row are coupled together, and second reset signal patterns 142 located in the same row are coupled together.

The second gate scanning signal pattern 141 is configured to provide the gate scanning signal $Gate_2[n]$ to the second gate scanning signal terminal $Gate_2$. Second reset signal patterns 142 are configured to provide reset signals to second reset signal terminals $Reset_2$, and the reset signals include, for example, the reset signal $Reset_2[n]$ and the reset signal $Reset_2[n-1]$.

Referring to FIG. 1C, the second thin film transistor T2' and the second thin film transistor T4' are coupled to the second gate scanning signal terminal $Gate_2$, and the second thin film transistor T1' and the second thin film transistor T7' are coupled to the second reset signal terminals $Reset_2$.

Therefore, referring to FIG. 5C, in the second pixel driving circuit 12, second thin film transistors including second gate scanning signal patterns 141 include, for example, the second thin film transistor T2' and the second thin film transistor T4', and second thin film transistors including second reset signal patterns 142 include, for example, the second thin film transistor T' and the second thin film transistor T7'.

An overlapping area of an orthographic projection of each of at least one first gate scanning signal pattern 131 on the substrate 10 and the orthographic projections of the first active patterns 15 on the substrate 10 is less than an overlapping area of an orthographic projection of each of at least one second gate scanning signal pattern 141 on the substrate 10 and the orthographic projections of the second active patterns 16 on the substrate 10.

Overlapping portions of a first gate scanning signal pattern 131 and a first active pattern 15 may develop a first channel capacitance of a first thin film transistor; and overlapping portions of a second gate scanning signal pattern 141 and a second active pattern 16 may develop a second channel capacitance of a second thin film transistor.

In a case where the first pixel driving circuit 11 and the second pixel driving circuit 12 are the 7T1C pixel driving circuits, and a coupling relationship between the first thin film transistors and the first storage capacitor C1 and a coupling relationship between the second thin film transistors and the second storage capacitor C2 are the same; the second channel capacitance of the second thin film transistor T2' is greater than the first channel capacitance of the first thin film transistor T2, and/or, the second channel capacitance of the second thin film transistor T4' is greater than the first channel capacitance of the first thin film transistor T4.

In some other embodiments, an overlapping area of an orthographic projection of each of at least one first reset signal pattern 132 on the substrate 10 and the orthographic projections of the first active patterns 15 on the substrate 10 is less than an overlapping area of an orthographic projection of each of at least one second reset signal pattern 142 on the substrate 10 and the orthographic projections of the second active patterns 16 on the substrate 10.

Overlapping portions of a first reset signal pattern 132 and a first active pattern may develop a first channel capacitance of a first thin film transistor; and overlapping portions of a second reset signal pattern 142 and a second active pattern 16 may develop a second channel capacitance of a second thin film transistor.

In a case where the first pixel driving circuit 11 and the second pixel driving circuit 12 are the 7T1C pixel driving circuits, and a coupling relationship between the first thin film transistors and the first storage capacitor C1 and a coupling relationship between the second thin film transistors and the second storage capacitor C2 are the same; the second channel capacitance of the second thin film transistor T' is greater than the first channel capacitance of the first thin film transistor T1, and/or, the second channel capacitance of the second thin film transistor T7' is greater than the first channel capacitance of the first thin film transistor T7.

Referring to FIG. 1B, the display brightness of the light-emitting device D is determined by an output current signal of the first thin film transistor T3; a magnitude of the output current signal of the first thin film transistor T3 is determined by a gate voltage thereof; and the gate voltage of the first thin film transistor T3 is determined by a magnitude and charging time of the first data signal. In a case where the first thin film transistor T3 is the P-type transistor, the first thin film transistor T3 is turned on when the gate voltage thereof is at a low level, and thus the larger the gate voltage of the first thin film transistor T3, the smaller the output current signal of the first thin film transistor T3. In a case where first data signal terminals $Data_1$ input the same first data signal to gates of first thin film transistors T3, if charging time of the gates of the first thin film transistors T3 is different, magnitudes of the gate voltages of the first thin film transistors T3 will also be different. When the first thin film transistor T2 and the first thin film transistor T4 are turned on, the first data signal is written into the gate of the first thin film transistor T3, so that the charging time of the first data signal is determined by turn-on time of the first thin film transistor T2 and turn-on time of the first thin film transistor T4. The turn-on time of the first thin film transistor T2 and the turn-on time of the first thin film transistor T4 are respectively determined by gate voltages of the first thin film transistor T2 and the first thin film transistor T4. The gate voltages of the first thin film transistor T2 and the first thin film transistor T4 are equal to the gate scanning signal $Gate_1[n]$. The gate scanning signal $Gate_1[n]$ is provided by the scanning signal line 180, and if the first data signals $Data_1$ are the same, scanning signal lines 180 with different total loads may respectively provide different gate scanning signals $Gate_1[n]$ to first pixel driving circuits 11, so that different first pixel driving circuits 11 have different charging time, resulting in different gate voltages of the first thin film transistors T3, and different magnitudes of the output current signals. In this case, second channel capacitances of the second thin film transistor T2' and the fourth thin film transistor T4' in the second pixel driving circuit 12 may be set to be relatively large to increase the total load on the scanning signal line 180, so that the gate scanning signal $Gate_1[n]$ received by the first pixel driving circuit 11 sharing the same scanning signal line 180 with the second pixel driving circuit 12 is approximately same as the gate scanning signal $Gate_1[n]$ received by the first pixel driving circuit 11 coupled to the scanning signal line 180 not passing through the reserved region 1020, thereby ensuring that charging time of the first pixel driving circuit 11 coupled to the scanning signal line 180 passing through the reserved region 1020 and charging time of the first pixel driving circuit 11 coupled to the scanning signal line 180 not passing through the reserved region 1020 are approximately the same. The charging time tends to be equal, the gate voltage of the first thin film transistor T3 in the first pixel driving circuit 11 coupled to the scanning signal line 180 passing through the reserved region 1020 is closer to the gate voltage of the first thin film transistor T3 in the first pixel driving circuit 11 coupled to the scanning signal line 180 not passing through the reserved region 1020, and the output signals tend to be equal.

Referring to FIG. 1C, two scanning signal lines 180 in the scanning signal line group 18 are connected in parallel, and one of the two scanning signal lines 180 is used to provide a reset signal to a second reset signal terminal Reset$_2$; and the gate of the second thin film transistor T1 is coupled to the second reset signal terminal providing the second reset signal Reset$_2$[n−1] in the (n−1)th row, and the gate of the second thin film transistor T7' is coupled to the second reset signal terminal providing the second reset signal Reset$_2$[n] in the nth row. Therefore, if a load on the second thin film transistor T' is adjusted, a total load on the scanning signal line group 18 in the (n−1)th row may be increased. If a load on the scanning signal line 180 for providing the reset signal Reset$_2$[n−1] is changed, a magnitude of a signal of a scanning signal line 180 for providing the gate scanning signal Gate$_2$[n−1] and is connected in parallel to the scanning signal line 180 for providing the reset signal Reset$_2$[n−1] may also be affected. Similarly, if a load on the second thin film transistor T7' is adjusted, a magnitude of a signal on a scanning signal line 180 for providing the gate scanning signal Gate$_2$[n] may be affected.

Therefore, the second channel capacitances of the second thin film transistor T' and the second thin film transistor T7' in the second pixel driving circuit 12 may be set to be relatively large, which makes the charging time of the first pixel driving circuit 11 coupled to the scanning signal line group 18 passing through the reserved region 1020 closer to the charging time of the first pixel driving circuit 11 coupled to the scanning signal line group 18 not passing through the reserved region 1020.

In some embodiments of the present disclosure, an increase of the load on any one scanning signal line 180 in the scanning signal line group 18 may result in an increase of the total load on the scanning signal line group 18, so that for the second pixel driving circuit 12, the second channel capacitance of the second thin film transistor coupled to the second gate scanning signal terminal Gate$_2$ and/or the second channel capacitance of the second thin film transistor coupled to the second reset signal terminal Reset$_2$ is set to be relatively large. In this way, in a process of writing the first data signal, a total load on each scanning signal line 180 passing through the reserved region 1020 and a total load on each scanning signal line 180 not passing through the reserved region 1020 are the same or approximately the same, which ensures that when the same first data signal is input to the display panel 1 to display the same theoretical brightness, a first data signal actually written into the gate of the first thin film transistor T3 in the first pixel driving circuit 11 coupled to the scanning signal line 180 passing through the reserved region 1020 is approximately equal to a first data actually written into the gate of the first thin film transistor T3 in the first pixel driving circuit 11 coupled to the scanning signal line 180 not passing through the reserved region 1020, thereby eliminating the mura phenomenon.

In some embodiments, referring to FIG. 4A as a layout diagram of the first pixel driving circuit 11, the first pixel driving circuit 11 includes: the first semiconductor layer 111, a first gate metal layer, a first conductive layer and a first metal layer 116 that are sequentially disposed on the substrate 10 in a thickness direction of the substrate 10.

Referring to FIG. 4B, the first semiconductor layer 111 is used to provide the first active patterns 15 of the first thin film transistors. A material of the first semiconductor layer 111 includes at least one of polycrystalline silicon and amorphous silicon. Some portions of the first semiconductor layer 111 are further doped with ions, such as P-type ions or N-type ions. For example, doped regions of the first semiconductor layer 111 are used to provide a source region and a drain region of the first thin film transistor.

Referring to FIG. 4C, the first gate metal layer is used to provide a first gate line 112 and a first reset signal line 113, and the first gate metal layer is made of, for example, silver. For example, a portion of the first gate line 112 overlapping with a portion of the first semiconductor layer 111 serves as a first gate scanning signal pattern 131 of a first thin film transistor; and a portion of the first reset signal line 113 overlapping with a portion of the first semiconductor layers 111 serves as a first reset signal pattern 132 of a first thin film transistor.

Figure 4D:
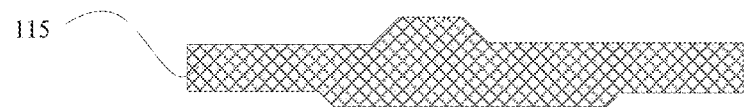
FIG. 4D is a structural diagram of a first conductive layer, in accordance with some embodiments of the present disclosure.
Figure 4D:
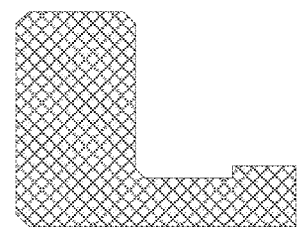
Figure 4D:
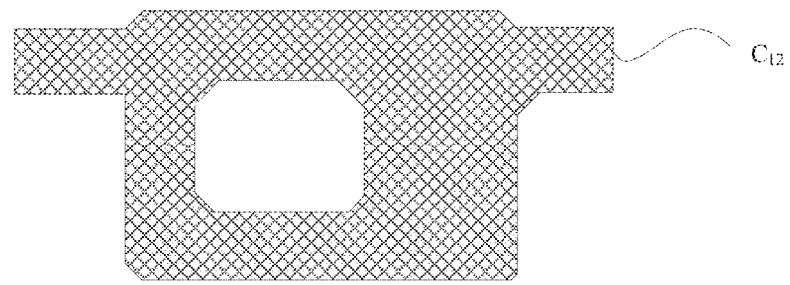
Figure 4D:
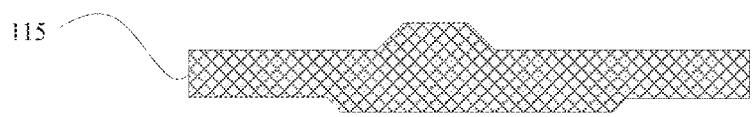

Referring to FIG. 4D, the first conductive layer is used to provide a first initial signal pattern 115 and an electrode $C_{12}$ of the first storage capacitor. For example, a material of the first conductive layer is any one of conductive metals such as silver and aluminum. The first initial signal pattern 115 is used to provide the initial signal to the first initial signal terminal Vinit$_1$ as shown in FIG. 1B, and the initial signal is, for example, a fixed voltage signal.

Figure 4E:
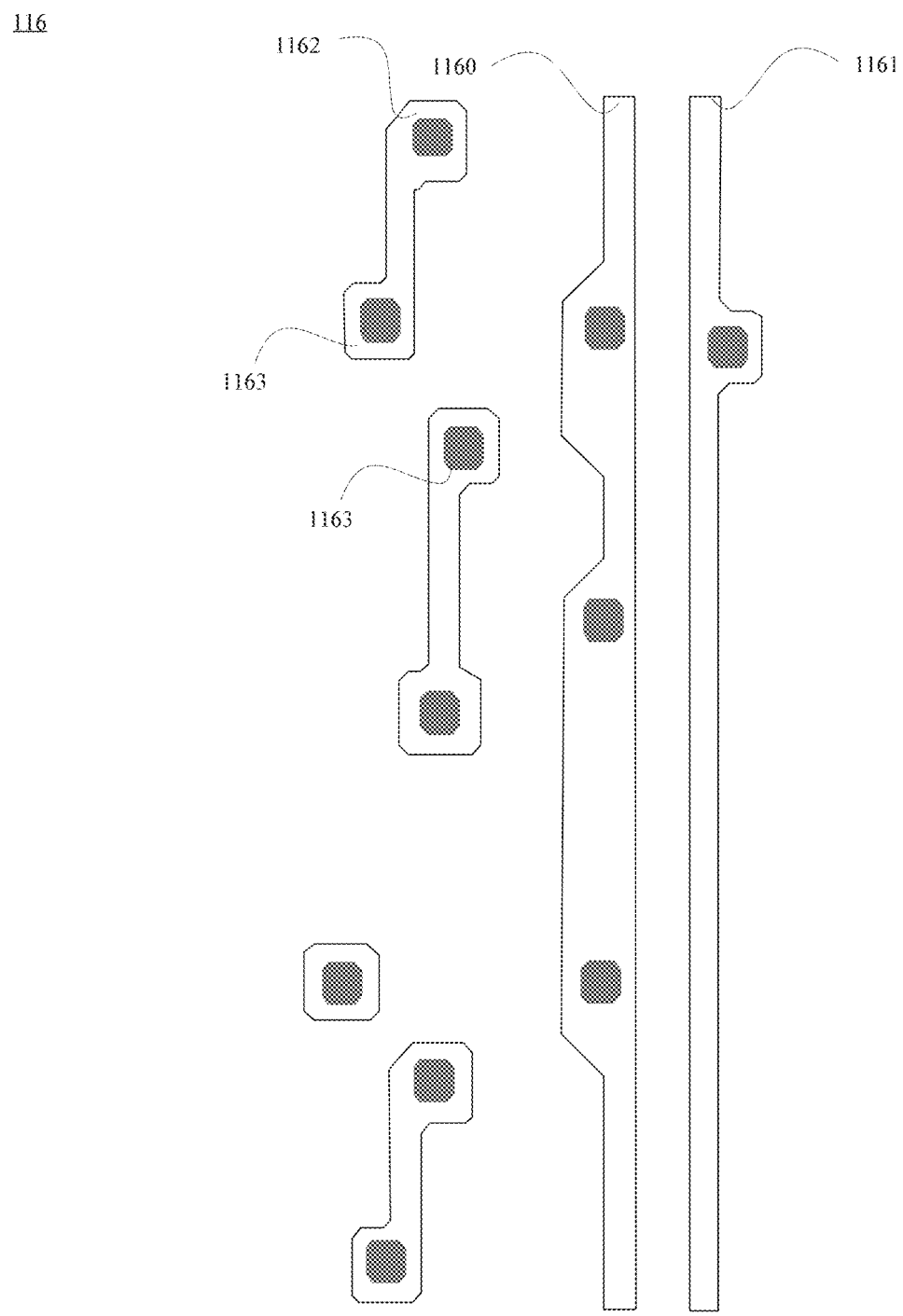
FIG. 4E is a structural diagram of a first metal layer, in accordance with some embodiments of the present disclosure.

Referring to FIG. 4E, the first metal layer 116 is used to provide a first data signal pattern 1161, a first power supply voltage signal pattern 1160 and a first connection pattern 1162. For example, a material of the first metal layer 116 is any one of conductive metals such as silver and aluminum. The first data signal pattern 1161 is used to provide the data signal to the first data signal terminal Data$_1$ as shown in FIG. 1B. The first power supply voltage signal pattern 1160 is used to provide the power supply voltage signal to the first power supply voltage signal terminal ELVDD$_1$ as shown in FIG. 1B. The first connection pattern 1162 is used to realize cross-layer coupling between layers (e.g., the first semiconductor layer 111, the first gate metal layer and the first conductive layer) needed to be coupled, and at least one first through hole 1163 is provided in the first connection pattern 1162. For example, referring to FIG. 4A, for the first thin film transistor T7, the first connection pattern 1162 is used to couple the first electrode of the first thin film transistor T7 to the first initial signal pattern 115; and the first connection pattern 1162 is further coupled to the source region (or the drain region) of the first thin film transistor T7, so that the initial signal provided by the first initial signal terminal Vinit$_1$ may be transmitted to the first thin film transistor T7.

Referring to FIG. 4A, FIG. 4A shows positions of the first thin film transistor T1, the first thin film transistor T2, the first thin film transistor T3, the first thin film transistor T4, the first thin film transistor T5, the first thin film transistor T6, the first thin film transistor T7 and the first storage capacitor C1 that are included in the first pixel driving circuit 11, a first thin film transistor T7(n−1) is a first thin film transistor T7 in the (n−1)th row, a first thin film transistor T7(n) is a first thin film transistor T7 in the nth row, the first thin film transistor T7(n−1) and the first thin film transistor T1 share one scanning signal line 180, which is, for example, a first reset signal line 113; the remaining first film transistors other than the first thin film transistor T7(n−1) are, for example, first thin film transistors in the nth row; and the first gate scanning signal pattern 131 of the first thin film transistor T3 is used as another electrode $C_{11}$ of the first storage capacitor C1. In combination with FIGS. 4A and 4C, portions of the first gate line 112 corresponding to positions of the first thin film transistor T2 and the first thin film transistor T4 serve as first gate scanning signal patterns 131 of the first thin film transistor T2 and the first thin film transistor T4, respectively; and portions of the first reset signal line 113 corresponding to positions of the first thin film transistor T1 and the first thin film transistor T7 serve as first reset signal patterns 132 of the first thin film transistor T1 and the first thin film transistor T7, respectively.

In some embodiments, referring to FIG. 5A, the second pixel driving circuit 12 further includes metal patterns 1264. Orthographic projections of the metal patterns 1264 on the substrate 10 overlap with the orthographic projections of the second scanning signal patterns 14 on the substrate 10. The metal patterns 1264 are configured to receive voltage signals.

The larger the overlapping region of the orthographic projection of the metal pattern 1264 on the substrate 10 and the orthographic projection of the second scanning signal pattern 14 on the substrate 10, the greater a parasitic capacitance created between the metal pattern 1264 and the second scanning signal pattern 14, and the greater a load on the second pixel driving circuit 12.

In some embodiments, referring to FIG. 5A as a layout diagram of the second pixel driving circuit 12, the second pixel driving circuit 12 includes: the second semiconductor layer 121, a second gate metal layer, a second conductive layer and a second metal layer 126 that are sequentially disposed on the substrate 10 in the thickness direction of the substrate 10.

Referring to FIG. 5B, the second semiconductor layer 121 is used to provide second active patterns 16 of the second thin film transistors. The second semiconductor layer 121 and the first semiconductor layer 111 are made of the same material.

Referring to FIG. 5C, the second gate metal layer is used to provide a second gate line 122 and a second reset signal line 123, and the second gate metal layer and the first gate metal layer are made of the same material. A portion of the second gate line 122 overlapping with a portion of the second semiconductor layer 121 serves as a second gate scanning signal pattern 141 of a second thin film transistor, and a portion of the second reset signal line 123 overlapping with a portion of the second semiconductor layer 121 serves as a second reset signal pattern 142 of a second thin film transistor.

Figure 5D:
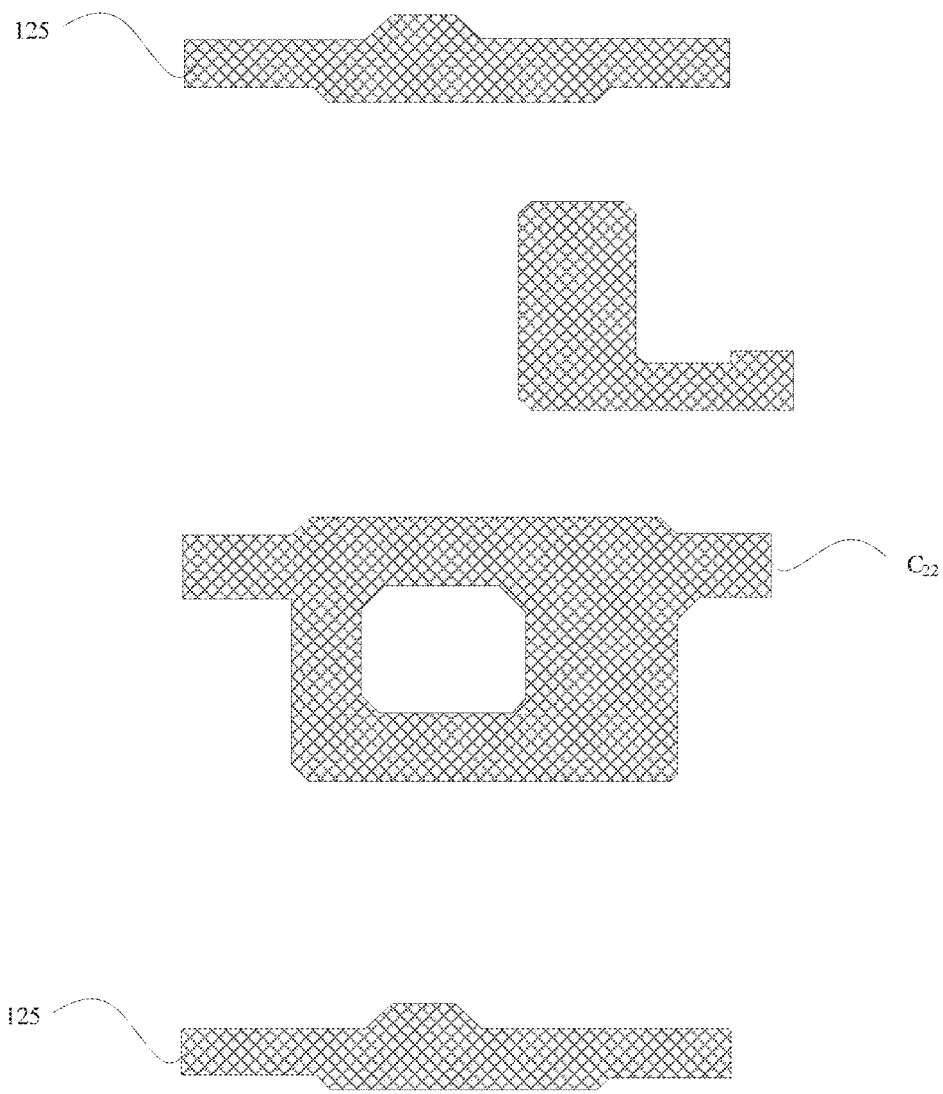
FIG. 5D is a structural diagram of a second conductive layer, in accordance with some embodiments of the present disclosure.

Referring to FIG. 5D, the second conductive layer is used to provide a second initial signal pattern 125, and an electrode $C_{22}$ of the second storage capacitor; and the second conductive layer and the first conductive layer are made of the same material. The second initial signal pattern 125 is used to provide an initial signal to the second initial signal terminal $Vinit_2$ as shown in FIG. 1C, and the initial signal is, for example, a fixed voltage signal.

Figure 5E:
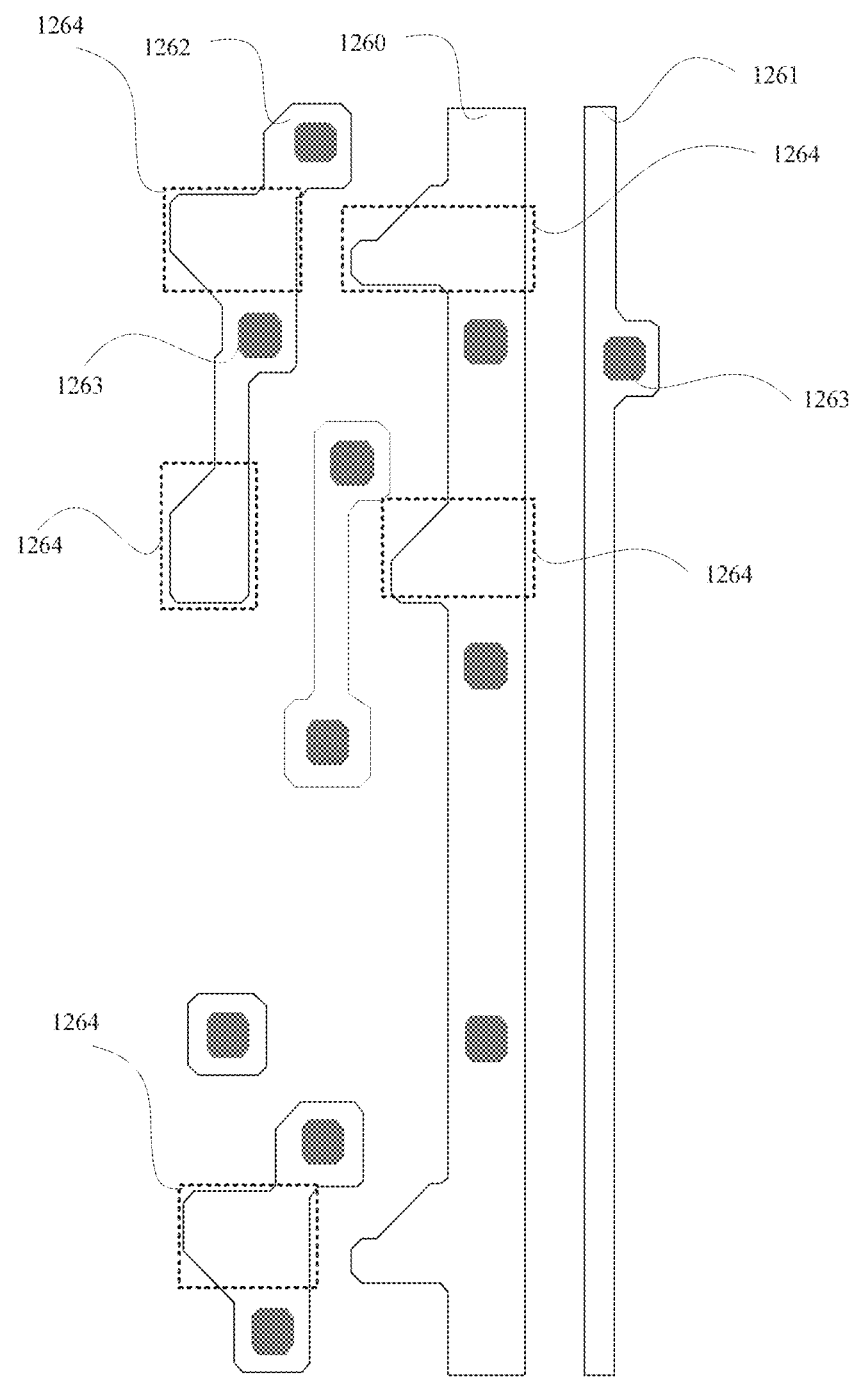
FIG. 5E is a structural diagram of a second metal layer, in accordance with some embodiments of the present disclosure.

Referring to FIG. 5E, the second metal layer 126 is used to provide a second data signal pattern 1261, a second power supply voltage signal pattern 1260, a second connection pattern 1262 and the metal pattern 1264; and the second metal layer 126 and the first metal layer 116 are made of the same material. The second data signal pattern 1261 is used to provide a data signal to the second data signal terminal $Data_2$ as shown in FIG. 1C; the second power supply voltage signal pattern 1260 is used to provide a power supply voltage signal to the second power supply voltage signal terminal $ELVDD_2$ as shown in FIG. 1C; the second connection pattern 1262 is used to realize a cross-layer coupling between layers (e.g., the second semiconductor layer 121, the second gate metal layer and the second conductive layer) needed to be coupled, and at least one second through hole 1263 is provided in the second connection pattern 1262. For example, referring to FIG. 5A, for the second thin film transistor T7', the second connection pattern 1262 is used to couple the second electrode of the second thin film transistor T7' to the second initial signal pattern 125; and the second connection pattern 1262 is further coupled to the source region (or the drain region) of the second thin film transistor T7', so that the initial signal provided by the second initial signal terminal $Vinit_2$ may be transmitted to the second thin film transistor T7'. The metal pattern 1264 overlaps with the second scanning signal pattern 14; the metal pattern 1264 is used to develop the parasitic capacitance with the second scanning signal pattern 14; and the voltage signal received by the metal pattern 1264 is, for example, a fixed voltage signal.

Referring to FIG. 5A, FIG. 5A shows positions of the second thin film transistor T1', the second thin film transistor T2', the second thin film transistor T3', the second thin film transistor T4', the second thin film transistor T5', the second thin film transistor T6', the second thin film transistor T7' and the second storage capacitor C2 that are included in the second pixel driving circuit 12, a second thin film transistor T7'(n−1) is a second thin film transistor T7' in the (n−1)th row, a second thin film transistor T7'(n) is a second thin film transistor T7' in the nth row, and the second thin film transistor T7'(n−1) and the second thin film transistor T' share one scanning signal line 180, which is, for example, the second reset signal line 123; the remaining second thin film transistors other than the second thin film transistor T7'(n−1) are, for example, second thin film transistors in the nth row. In addition, the second gate scanning signal pattern 141 of the second thin film transistor T3 is used as another electrode $C_{21}$ of the second storage capacitor C2. In combination with FIGS. 5A and 5C, portions of the second gate line 122 corresponding to positions of the second thin film transistor T2' and the second thin film transistor T4' serve as second gate scanning signal patterns 141 of the second thin film transistor T2' and the second thin film transistor T4', respectively; and portions of the second reset signal line 123 corresponding to positions of the second thin film transistor T' and the second thin film transistor T7' serve as second reset signal patterns 142 of the second thin film transistor T' and the second thin film transistor T7', respectively.

The second pixel driving circuit 12 further includes the metal pattern 1264, and the metal pattern 1264 may develop the parasitic capacitance with the second scanning signal pattern 14, thereby further increasing the load on the second pixel driving circuit 12, which is beneficial to make the total load on the scanning signal line 180 passing through the reserved region 1020 closer to the total load on the scanning signal line 180 not passing through the reserved region 1020.

In combination with FIGS. 4A and 5A, in the length direction of the display panel 1, first gate lines 112 and second gate lines 122 are coupled together to constitute a scanning signal line 180 in a scanning signal line group 18 as shown in FIG. 1A, and the scanning signal line 180 is used to provide a gate scanning signal Gate[n] (including the first gate scanning signal $Gate_1[n]$ and the second gate scanning signal $Gate_2[n]$); and first reset signal lines 113 and second reset signal lines 123 are coupled together to constitute another scanning signal line 180 in the scanning signal line group 18, and the another scanning signal line 180 is used to provide a reset signal Reset[n] (including the first reset signal $Reset_1[n]$ and the second reset signal $Reset_2[n]$), and the first thin film transistor T1 and the second thin film transistor T1' that are located in a same row are coupled to a scanning signal line 180 in a previous row for providing a reset signal.

Based on the above, it will be understood by those skilled in the art that the scanning signal of the same scanning signal line 180 is the same. Therefore, the first gate scanning signal $Gate_1[n]$ and the second gate scanning signal $Gate_2[n]$ provided by the scanning signal line 180 are the same, or the first reset signal $Reset_1[n-1]$ and the second reset signal $Reset_2[n-1]$ provided by the scanning signal line 180 are the same, or the first reset signal $Reset_1[n]$ and the second reset signal $Reset_2[n]$ provided by the scanning signal line 180 are the same.

In combination with FIGS. 1A, 4A and 5A, in the width direction of the display panel 1, first data signal patterns 1161 and second data signal patterns 1261 may be coupled together to constitute a data signal line, and sub-pixels in the same column are coupled to the same data signal line; in the length direction of the display panel 1, first light-emitting control lines 114 and second light-emitting control lines 124 may be coupled together to constitute a light-emitting control line, and sub-pixels in the same row are coupled to the same light-emitting control line; in the length direction of the display panel 1, first initial signal patterns 115 and second initial signal patterns 125 may be coupled together to constitute an initial signal line, and sub-pixels in the same row are coupled to the same initial signal line; in the width direction of the display panel 1, first power supply voltage signal patterns 1160 and second power supply voltage signal patterns 1260 may be coupled together to constitute a power supply voltage signal line, and sub-pixels in the same column are coupled to the same power supply voltage signal line. On this basis, those skilled in the art will understand that the same signal line transmits the same signal at the same time. For example, a first power supply voltage signal provided by the first power supply voltage signal pattern 1160 and a second power supply voltage signal provided by the second power supply voltage signal pattern 1260 are the same.

In some embodiments, referring to FIG. 5A, the second power supply voltage signal pattern 1260 is coupled to the metal pattern 1264, and the second power supply voltage signal pattern 1260 is configured to provide the second power supply voltage signal to the metal pattern 1264.

For example, as shown in FIG. 5A, there are two metal patterns 1264 coupled to the second power supply voltage signal pattern 1260, one of the two metal patterns 1264 develops a parasitic capacitance with the second reset signal pattern 142 of the second thin film transistor T1', and the other one of the two metal patterns 1264 develops a parasitic capacitance with the second gate scanning signal pattern 141 of the second thin film transistor T4'.

By using the second power supply voltage signal pattern 1260 to transmit the voltage signal to the metal patterns 1264, there is no need to add a new voltage signal, so that the utilization rate of the existing signal in the display panel 1 is high.

In some embodiments, the metal patterns 1264 and the second power supply voltage signal pattern 1260 are arranged in the same layer and made of the same material.

The "same layer" refers to a layer structure, which is formed by forming a layer used for obtaining specific patterns through the same one film-forming process and then performing a single patterning process by using the same one mask. Depending on different specific patterns, the single patterning process may include several exposure, development or etching processes, the specific patterns in the formed layer structure may be continuous or discontinuous, and the specific patterns may also be at different heights or have different thicknesses.

The material of the second power supply voltage signal pattern 1260 is, for example, the conductive metal; and the conductive metal includes, for example, silver, aluminum, titanium (Ti), etc. The second power supply voltage signal pattern 1260 may be a one-layer structure or a multi-layer structure (e.g., a three-layer structure of Ti, Al and Ti).

The metal patterns 1264 and the second power supply voltage signal pattern 1260 are formed at the same time. Therefore, a coupling relationship between the metal pattern 1264 and the second power supply voltage signal pattern 1260 is relatively stable, and a process of fabricating the metal patterns 1264 is relatively simple.

In some embodiments, the second initial signal pattern 125 is coupled to a metal pattern 1264, and the second initial signal pattern 125 is configured to provide a second initial signal to the metal pattern 1264.

For example, referring to FIG. 5A, there are two metal patterns 1264 coupled to the second initial signal pattern 125, one of the two metal patterns 1264 develops a parasitic capacitance with the second reset signal pattern 142 of the second thin film transistor T7', and the other one of the two metal patterns 1264 develops a parasitic capacitance with the second gate scanning signal pattern 141 of the second thin film transistor T2'.

It will be understood by those skilled in the art that, in a case where there is one metal pattern 1264, any one of the second power supply voltage signal pattern 1260 and the second initial signal pattern 125 may provide the fixed voltage signal to the metal pattern 1264. In a case where there are a plurality of metal patterns 1264, all metal patterns 1264 may be provided with the second power supply voltage signal by the second power supply voltage signal pattern 1260; or, all metal patterns 1264 may be provided with the second initial signal by the second initial signal pattern 125; or, a part of the metal patterns 1264 may be provided with the second power supply voltage signal by the second power supply voltage signal pattern 1260, and the remaining part of the metal patterns 1264 may be provided with the second initial signal by the second initial signal pattern 125. The embodiments of the present disclosure are not limited thereto.

Beneficial effects of providing the second initial signal for the metal pattern 1264 by the second initial signal pattern 125 and providing the second power supply voltage signal for the metal pattern 1264 by the second power supply voltage signal pattern 1260 are the same. In a case where the second power supply voltage signal pattern 1260 and the second initial signal pattern 125 respectively provide voltage signals to different metal patterns 1264, the number of metal patterns 1264 may be set to be greater, thereby maximizing the load on the second pixel driving circuit 12.

Figure 4F:
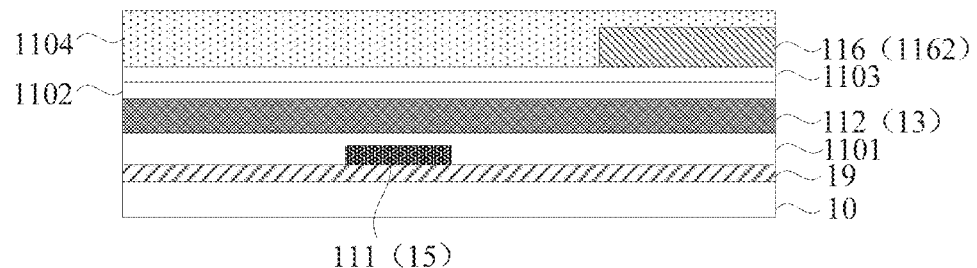
FIG. 4F is a section structural diagram of the display panel in FIG. 4A taken along the line A-A'.

Referring to FIGS. 4A and 5A, insulating layers between the layers are not shown in these two figures. In order to show a positional relationship of the layers in the display panel 1 in a thickness direction of the display panel 1, with reference to the line A-A' in FIG. 4A, a section structural diagram of the display panel 1 taken along the line A-A' as shown in FIG. 4F is obtained. Similarly, with reference to the line B-B' in FIG. 4A, a section structural diagram of the display panel 1 taken along the line B-B' as shown in FIG. 4G is obtained; with reference to the line C-C' in FIG. 5A, a section structural diagram of the display panel 1 taken along the line C-C' as shown in FIG. 5F is obtained; and with reference to the line D-D' in FIG. 5A, a section structural diagram of the display panel 1 taken along the line D-D' as shown in FIG. 5G is obtained.

Figure 4G:
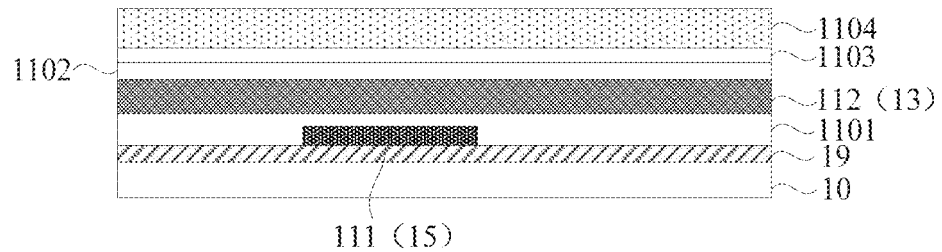
FIG. 4G is a section structural diagram of the display panel in FIG. 4A taken along the line B-B'.

Referring to FIGS. 4F and 4G, the display panel includes: in a region where the first pixel driving circuit 11 is located, a portion of the substrate 10, a portion of a buffer layer 19, the first semiconductor layer 111, a portion of a first inorganic layer 1101, the first gate line 112, a portion of a second inorganic layer 1102, a portion of a third inorganic layer 1103, the first metal layer 116 and a portion of a planarization layer 1104.

Figure 5F:
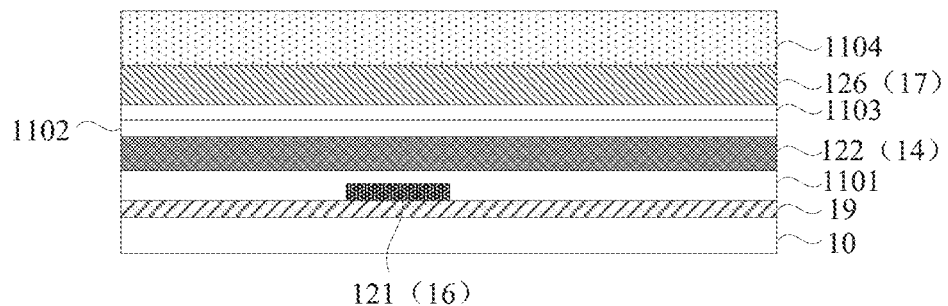
FIG. 5F is a section structural diagram of the display panel in FIG. 5A taken along the line C-C'.
Figure 5G:
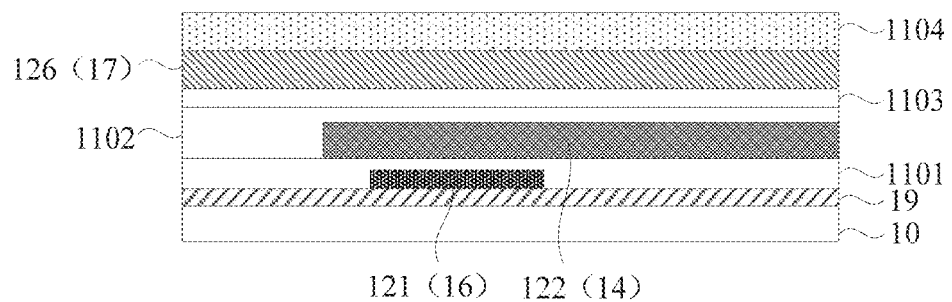
FIG. 5G is a section structural diagram of the display panel in FIG. 5A taken along the line D-D'.

Referring to FIGS. 5F and 5G, the display panel includes: in a region where the second pixel driving circuit 12 is located, a portion of the substrate 10, a portion of the buffer layer 19, the second semiconductor layer 121, a portion of the first inorganic layer 1101, the second gate line 122, a portion of the second inorganic layer 1102, a portion of the third inorganic layer 1103, the second metal layer 126 and a portion of the planarization layer 1104.

For example, the buffer layer 19 is made of silicon oxide ($SiO_x$). The buffer layer 19 may make the substrate 10 more planar and prevent ions in the substrate 10 from affecting the first semiconductor layer 111 and the second semiconductor layer 121.

The material of the first inorganic layer 1101 is, for example, at least one of the silicon oxide and silicon nitride (SiN); the material of the second inorganic layer 1102 is, for example, at least one of the silicon oxide and silicon nitride; and the material of the third inorganic layer 1103 is, for example, at least one of the silicon oxide and silicon nitride. The first inorganic layer 1101, the second inorganic layer 1102 and the third inorganic layer 1103 each play a role of insulation. The first inorganic layer 1101 may also be referred to as a gate insulating layer, and the second inorganic layer 1102 and the third inorganic layer 1103 may also be referred to as interlayer insulating layers.

Referring to FIGS. 4F, 4G, 5F and 5G, the schematic structure is a structure of a thin film transistor. Therefore, a portion of the first semiconductor layer 111 may also be understood as the first active pattern 15, a portion of the first gate line 112 may also be understood as the first scanning signal pattern 13, and a portion of the first metal layer 116 may also be understood as the first connection pattern 1162; and a portion of the second semiconductor layer 121 may also be understood as the second active pattern 16, a portion of the second gate line 122 may also be understood as the second scanning signal pattern 14, and a portion of the second metal layer 126 may also be understood as the metal pattern 1264.

For example, referring to FIGS. 4B and 5B, widths of portions of the first semiconductor layer 111 at positions where the first thin film transistor T1, the first thin film transistor T2, the first thin film transistor T4 and the first thin film transistor T7 are located are less than widths of portions of the second semiconductor layer 121 at positions where the second thin film transistor T', the second thin film transistor T2', the second thin film transistor T4' and the second thin film transistor T7' are located. For example, a width of a portion of the first semiconductor layer 111 at a position where the first thin film transistor T1 is located is less than a width of a portion of the second semiconductor layer 121 at a position where the second thin film transistor T' is located, and it can also be understood that the width of the first active pattern 15 is less than the width of the second active pattern 16.

In combination with FIGS. 1A and 5A, some embodiments of the present disclosure further provide another display panel 1, and the display panel 1 includes the substrate 10, the first pixel driving circuit 11, the second pixel driving circuit 12 and the metal patterns 1264.

The first pixel driving circuit 11 is disposed in the display region 101, and the first pixel driving circuit 11 includes first scanning signal patterns 13 and first active patterns 15.

The second pixel driving circuit 12 is disposed in the non-display region 102, the second pixel driving circuit 12 includes second scanning signal patterns 14 and second active patterns 16, and the second scanning signal pattern 14 is coupled to the first scanning signal pattern 13.

For example, the second pixel driving circuit 12 is disposed in the reserved region 1020 in the non-display region 102.

The orthographic projections of the metal patterns 1264 on the substrate 10 overlap with the orthographic projections of the second scanning signal patterns 14 on the substrate 10, and the metal patterns 1264 are configured to receive voltage signals.

In the display panel 1, a size of the first active pattern 15 and a size of the second active patterns 16 may be set to be the same, and a size of the first scanning signal pattern 13 and a size of the second scanning signal pattern 14 may also be set to be the same. For the description of the first pixel driving circuit 11 and the second pixel driving circuit 12 except for the sizes of the first active pattern 15, the second active pattern 16, the first scanning signal pattern 13 and the second scanning signal pattern 14, reference may be made to the foregoing description of the first pixel driving circuit 11 and the second pixel driving circuit 12.

For the description of the metal pattern 1264, reference may be made to the foregoing description of the metal pattern 1264, and details will not be repeated here.

By providing the metal pattern 1264 in the display panel, a parasitic capacitance may be created between the metal pattern 1264 and the second scanning signal pattern 14, so that the load on the second pixel driving circuit 12 is increased. Since the load on the second pixel driving circuit 12 is increased, the total load on each of all the scanning signal lines 180 in the display panel 1 may be approximately the same, and the mura phenomenon of the display panel 1 may be eliminated.

In some embodiments, referring to FIGS. 6A to 6D, the reserved region 1020 is further provided with at least one reserved hole 1021 therein. The reserved hole 1021 is, for example, a through hole, and the reserved hole 1021 is used to install a sensor such as a front camera.

For example, referring to FIGS. 6A to 6D, a shape of the reserved region 1020 is circular, racetrack-shaped or rectangular.

In some other embodiments, the shape of the reserved region 1020 may also be drop-shaped, elliptical, or special-shaped. The shape of the reserved region 1020 is not limited in the embodiments of the present disclosure.

Figure 6A:
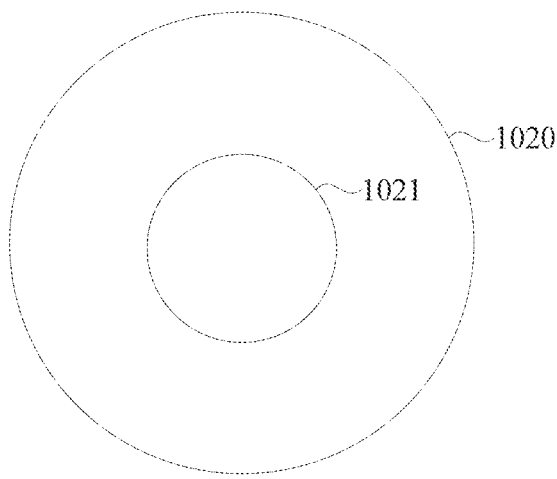
FIGS. 6A to 6C are structural diagrams of reserved regions, in accordance with some embodiments of the present disclosure.
Figure 6B:
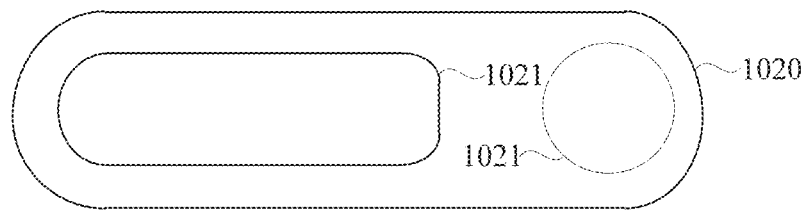
Figure 6C:
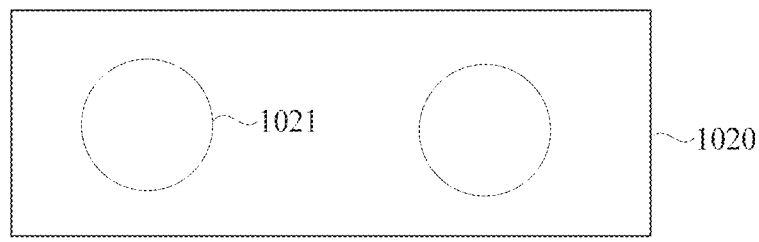

Referring to FIGS. 6A to 6D, a shape of the reserved hole 1021 is, for example, circular, rectangular, elliptical, racetrack-shaped or special-shaped. Referring to FIG. 6A, there may be one reserved hole 1021. Alternatively, referring to FIGS. 6B to 6D, there may be more reserved holes 1021. The shape of the reserved hole 1021 and the number of reserved holes 1021 are not limited in the embodiments of the present disclosure, as long as the shape of the reserved hole 1021 matches a shape of the sensor installed therein and the number of reserved holes 1021 corresponds to the number of sensors.

Figure 6D:
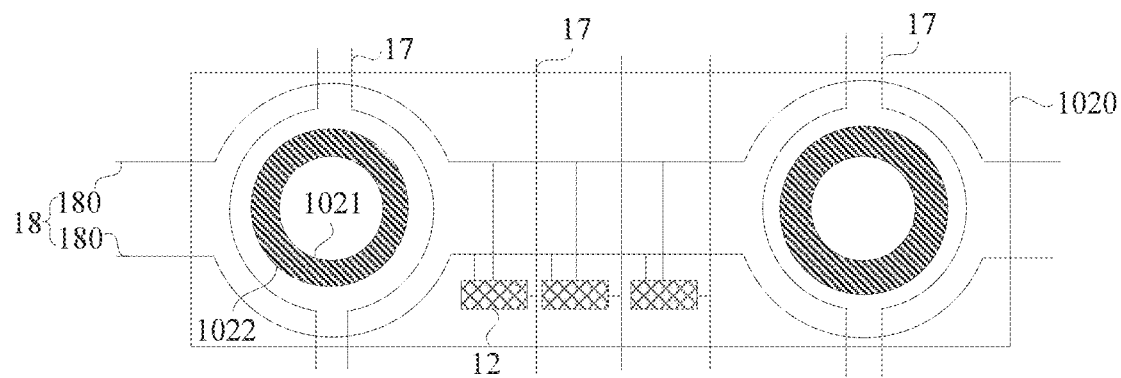
FIG. 6D is a diagram showing a positional relationship of scanning signal lines, data signal lines and second pixel driving circuits in a reserved region, in accordance with some embodiments of the present disclosure.

For example, referring to FIG. 6D, the reserved hole 1021 is circular. In order to prevent water vapor in the air from entering the display panel 1, an isolation column 1022 is provided around the reserved hole 1021. The isolation column 1022 is disposed around the reserved hole 1021 in a circumferential direction thereof. For example, the isolation column 1022 is made of an organic material, such as polyimide. If there is one isolation column 1022, a top view of the isolation column 1022 is, for example, annular; if there are more isolation columns 1022, the isolation columns 1022 are arranged around the reserved hole 1021 in a circle, and a section of each isolation column 1022 is, for example, rectangular or T-shaped.

Since a part of the scanning signal line groups 18 and data signal lines 17 pass through the reserved region 1020, and the reserved hole 1021 exists in the reserved region 1020, scanning signal lines 180 in the part of the scanning signal line groups 18 and the data signal lines 17 need to detour around the reserved hole 1021.

In some embodiments, referring to FIG. 6D, two reserved holes 1021 have a relatively large space therebetween, so that the second pixel driving circuit 12 is arranged between the two reserved holes 1021.

The reserved hole 1021 is provided in the reserved region 1020, and the sensor may be installed in the reserved hole 1021, which is conducive to reducing an overall thickness of the display panel.

Some embodiments of the present disclosure further provide a manufacturing method of the display panel 1, and the manufacturing method includes as follows.

Referring to FIG. 1A, the first pixel driving circuit 11 and the second pixel driving circuit 12 are synchronously formed on the substrate 10, the first pixel driving circuit 11 is located in the display region 101, and the second pixel driving circuit 12 is located in the non-display region 102.

In some embodiments, the non-display region 102 and reserved region 1020 completely coincide. In some other embodiments, an area of the non-display region 102 is much greater than an area of the reserved region 1020. The embodiments of the present disclosure are not limited thereto.

For example, the second pixel driving circuit 12 is disposed in the reserved region 1020.

The first pixel driving circuit 11 includes the first scanning signal pattern 13 and the first active pattern 15; and the second pixel driving circuit 12 includes the second scanning signal pattern 14 and the second active pattern 16, the second scanning signal pattern 14 being coupled to the first scanning signal pattern 13.

Referring to FIGS. 2A to 2D, the overlapping area of the orthographic projection of each of at least one first scanning signal pattern 13 on the substrate 10 and the orthographic projections of the first active patterns 15 on the substrate 10 is less than the overlapping area of the orthographic projection of each of at least one second scanning signal pattern 14 on the substrate 10 and the orthographic projections of the second active patterns 16 on the substrate 10.

A plurality of first active patterns 15 in the first pixel driving circuit 11 and a plurality of second active patterns 16 in the second pixel driving circuit 12 are synchronously formed. For example, referring to FIGS. 4B and 5B, the plurality of first active patterns 15 are synchronously formed by the first semiconductor layer 111, and the plurality of second active patterns 16 are synchronously formed by the second semiconductor layer 121. The first semiconductor layer 111 and the second semiconductor layer 121 may also be synchronously formed. In this way, the manufacturing process is simple.

A plurality of first scanning signal patterns 13 in the first pixel driving circuit 11 and a plurality of second scanning signal patterns 14 in the second pixel driving circuit 12 are synchronously fabricated. Referring to FIGS. 4C and 5C, the plurality of first scanning signal patterns 13 are synchronously formed by the first gate line 112 and the first reset signal line 113; the plurality of second scanning signal patterns 14 are synchronously formed by the second gate line 122 and the second reset signal line 123; and the first gate line 112, the first reset signal line 113, the second gate line 122 and the second reset signal line 123 may also be synchronously fabricated. In this way, the manufacturing process is simple.

The manufacturing method of the display panel 1 provided in some embodiments of the present disclosure has the same beneficial effects as the display panel described above, and details will not be repeated.

In some embodiments, the first scanning signal pattern 13 and the second scanning signal pattern 14 are synchronously formed and have the same size.

For example, the first scanning signal pattern 13 includes the first gate scanning signal pattern 131 and the first reset signal pattern 132, and the second scanning signal pattern 14 includes the second gate scanning signal pattern 141 and the second reset signal pattern 142.

First gate scanning signal patterns 131 are coupled to constitute the first gate line 112 as shown in FIG. 4C, and first reset signal patterns 132 are coupled to constitute the first reset signal line 113 as shown in FIG. 4C. Second gate scanning signal patterns 141 are coupled to constitute the second gate line 122 as shown in FIG. 5C, and second reset signal patterns 142 are coupled to constitute the second reset signal line as shown in FIG. 5C.

The first gate line 112 and the second gate line 122 are coupled, so as to obtain one scanning signal line 180 in a scanning signal line group 18 as shown in FIG. 1A, and the first reset signal line 113 and the second reset signal line 123 are coupled, so as to obtain the other scanning signal line 180 in the scanning signal line group 18 as shown in FIG. 1A.

In a case where the first scanning signal pattern 13 and the second scanning signal pattern 14 are synchronously formed and have the same size, the obtained scanning signal line 180 have a good width uniformity and a good aesthetic.

In some embodiments, the first active pattern 15 and the second active pattern 16 are synchronously formed, and in a length direction of the substrate 10, the size of at least one first active pattern 15 is less than the size of at least one second active pattern 16.

The length direction of the substrate 10 may be understood as the row direction of the sub-pixels P, and a width direction of the substrate 10 may be understood as the column direction of the sub-pixels P.

For example, referring to FIG. 4B, a portion of the first semiconductor layer 111 at a position where each first thin film transistor is located may be understood as a first active pattern 15; and referring to FIG. 5B, a portion of the second semiconductor layer 121 at a position where each second thin film transistor is located may be understood as a second active pattern 16. A width of the second active pattern 16 of the second thin film transistor T1' is greater than a width of the first active pattern 15 of the first thin film transistor T1; a width of the second active pattern 16 of the second thin film transistor T7' is greater than a width of the first active pattern 15 of the first thin film transistor T7; a width of the second active pattern 16 of the second thin film transistor T4' is greater than a width of the first active pattern 15 of the first thin film transistor T4; and a width of the second active pattern 16 of the second thin film transistor T2' is greater than a width of the first active pattern 15 of the first thin film transistor T2.

The first semiconductor layer 111 and the second semiconductor layer 121 are synchronously fabricated, so that a manufacturing process of the first active pattern 15 and the second active pattern 16 is simple. In addition, the second channel capacitance may be greatly increased by increasing the size of the second active pattern 16.

In some embodiments, referring to FIG. 5A, the manufacturing method of the display panel 1 further includes forming the metal patterns 1264 on a side of the second scanning signal patterns 14 away from the substrate 10. The orthographic projections of the metal patterns 1264 on the substrate 10 overlap with the orthographic projections of the second scanning signal patterns 14 on the substrate 10, and the metal patterns 1264 are configured to receive the voltage signals.

For example, the metal pattern 1264 and the second power supply voltage signal pattern 1260 are integrally formed, or the metal pattern 1264 and the second connection pattern 1262 are integrally formed.

For example, voltage signals received by metal patterns 1264 include the second power supply voltage signal and/or the second initial signal.

The metal pattern 1264 may further increase the load on the second pixel driving circuit 12, and the total load on the scanning signal line 180 passing through the reserved region 1020 and the total load on the scanning signal line 180 not passing through the reserved region 1020 are approximately the same, thereby eliminating the phenomenon of mura occurring in the display panel 1.

Some embodiments of the present disclosure further provide another manufacturing method of the display panel 1, and the manufacturing method includes as follows.

Referring to FIG. 1A, the first pixel driving circuit 11 and the second pixel driving circuit 12 are simultaneously formed on the substrate 10; and the first pixel driving circuit 11 includes the first scanning signal pattern 13 and the first active pattern 15, the second pixel driving circuit 12 includes the second scanning signal pattern 14 and the second active pattern 16, and the second scanning signal pattern 14 is coupled to the first scanning signal pattern 13.

Referring to FIG. 5A, the metal patterns 1264 are formed on the side of the second scanning signal patterns 14 away from the substrate 10; and the orthographic projections of the metal patterns 1264 on the substrate 10 overlap with the orthographic projections of the second scanning signal patterns 14 on the substrate 10, and the metal patterns 1264 are configured to receive the voltage signals.

For the description of the metal pattern 1264, reference may be made to the foregoing description of the metal pattern 1264, which will not be repeated here.

The metal pattern 1264 and the second scanning signal pattern 14 may develop a parasitic capacitance, so that the load on the second pixel driving circuit 12 is greater than the load on the first pixel driving circuit 11. As a result, the total load on the scanning signal line 180 passing through the reserved region 1020 and the total load on the scanning signal line 180 not passing through the reserved region 1020 are approximately the same, thereby eliminating the mura phenomenon of the display panel 1.

It will be understood by those skilled in the art that, in FIGS. 1A and 3A, the number of the first pixel driving circuits 11, the number of second pixel driving circuits 12, the number of scanning signal lines coupled to the first pixel driving circuits 11 in the same row, or the number of scanning signal lines coupled to the first pixel driving circuits 11 and the second pixel driving circuits 12 in the same row are merely illustrative, and the number of first pixel driving circuits 11, the number of second pixel driving circuits 12 and the number of scanning signal lines in the display panel are not limited thereto. Moreover, in FIGS. 1A and 3A, in the row direction of the sub-pixels P, it is only illustrated that the sub-pixels P in the first row includes first pixel driving circuits 11 and second pixel driving circuits 12. That is, there is only one scanning signal line 180 passing through the reserved region 1020. However, there may also be more scanning signal lines 180 passing through the reserved region 1020. The present disclosure is not limited thereto.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, having a display region and a non-display region located on a periphery of the display region; the display panel comprising:
    a substrate;
    a first pixel driving circuit disposed in the display region, including first scanning signal patterns and first active patterns; and
    a second pixel driving circuit disposed in the non-display region, including second scanning signal patterns and second active patterns; wherein
    a first scanning signal pattern is coupled to a second scanning signal pattern; and
    an overlapping area of an orthographic projection of each of at least one first scanning signal pattern on the substrate and orthographic projections of the first active patterns on the substrate is less than an overlapping area of an orthographic projection of each of at least one second scanning signal pattern on the substrate and orthographic projections of the second active patterns on the substrate.

2. The display panel according to claim 1, wherein the first scanning signal patterns and the second scanning signal patterns have a same size.

3. The display panel according to claim 1, wherein in a length direction of the substrate, a size of each of at least one first active pattern is less than a size of each of at least one second active pattern.

4. The display panel according to claim 1, wherein
    the first scanning signal patterns include at least one of first gate scanning signal patterns or first reset signal patterns;
    the second scanning signal patterns include at least one of second gate scanning signal patterns or second reset signal patterns;
    an overlapping area of an orthographic projection of each of at least one first gate scanning signal pattern on the substrate and the orthographic projections of the first active patterns on the substrate is less than an overlapping area of an orthographic projection of each of at least one second gate scanning signal pattern on the substrate and the orthographic projections of the second active patterns on the substrate; and/or an overlapping area of an orthographic projection of each of at least one first reset signal pattern on the substrate and the orthographic projections of the first active patterns on the substrate is less than an overlapping area of an orthographic projection of each of at least one second reset signal pattern on the substrate and the orthographic projections of the second active patterns on the substrate.

5. The display panel according to claim 1, wherein the second pixel driving circuit further includes metal patterns, orthographic projections of the metal patterns on the substrate overlap with orthographic projections of the second scanning signal patterns on the substrate, and the metal patterns are configured to receive voltage signals.

6. The display panel according to claim 5, wherein the second pixel driving circuit further includes a second power supply voltage signal pattern coupled to a metal pattern, and the second power supply voltage signal pattern is configured to provide a second power supply voltage signal to the metal pattern.

7. The display panel according to claim 6, wherein the metal pattern and the second power supply voltage signal pattern are arranged in a same layer and made of a same material.

8. The display panel according to claim 5, wherein the second pixel driving circuit further includes a second initial signal pattern coupled to a metal pattern, and the second initial signal pattern is configured to provide a second initial signal to the metal pattern.

9. The display panel according to claim 1, wherein the non-display region includes a reserved region; and in a length direction of the substrate, first pixel driving circuits are provided in the display region and located on two opposite sides of the reserved region.

10. A display apparatus, comprising the display panel according to claim 1.

11. A display panel having a display region and a non-display region located on a periphery of the display region;
the display panel comprising:
a substrate;
a first pixel driving circuit disposed in the display region, including first scanning signal patterns and first active patterns;
a second pixel driving circuit disposed in the non-display region, including second scanning signal patterns and second active patterns, wherein a second scanning signal pattern is coupled to a first scanning signal pattern; and
metal patterns, wherein orthographic projections of the metal patterns on the substrate overlap with orthographic projections of the second scanning signal patterns on the substrate, and the metal patterns are configured to receive voltage signals.

12. A manufacturing method of the display panel according to claim 11, the display panel having the display region and the non-display region located on the periphery of the display region;
the manufacturing method comprising:
forming the first pixel driving circuit and the second pixel driving circuit synchronously on the substrate, wherein the first pixel driving circuit including the first scanning signal patterns and the first active patterns, the second pixel driving circuit includes the second scanning signal patterns and the second active patterns, and the second scanning signal pattern is coupled to the first scanning signal pattern; and forming the metal patterns on a side of the second scanning signal patterns away from the substrate, wherein the orthographic projections of the metal patterns on the substrate overlap with the orthographic projections of the second scanning signal patterns on the substrate, and the metal patterns are configured to receive the voltage signals.

13. The display panel according to claim 11, wherein the first scanning signal patterns and the second scanning signal patterns have a same size.

14. The display panel according to claim 11, wherein the second pixel driving circuit further includes a second power supply voltage signal pattern coupled to a metal pattern, and the second power supply voltage signal pattern is configured to provide a second power supply voltage signal to the metal pattern; and/or the second pixel driving circuit further includes a second initial signal pattern coupled to another metal pattern, and the second initial signal pattern is configured to provide a second initial signal to the another metal pattern.

15. A manufacturing method of a display panel, the display panel having a display region and a non-display region located on a periphery of the display region;
the manufacturing method comprising:
forming a first pixel driving circuit and a second pixel driving circuit synchronously on a substrate, wherein the first pixel driving circuit is located in the display region, and the second pixel driving circuit is located in the non-display region;
the first pixel driving circuit includes first scanning signal patterns and first active patterns, the second pixel driving circuit includes second scanning signal patterns and second active patterns, and a second scanning signal pattern is coupled to a first scanning signal pattern; and
an overlapping area of an orthographic projection of each of at least one first scanning signal pattern on the substrate and orthographic projections of the first active patterns on the substrate is less than an overlapping area of an orthographic projection of each of at least one second scanning signal pattern on the substrate and orthographic projections of the second active patterns on the substrate.

16. The manufacturing method according to claim 15, wherein the first scanning signal patterns and the second scanning signal patterns are synchronously formed and have a same size.

17. The manufacturing method according to claim 15, wherein the first active patterns and the second active patterns are synchronously formed; and in a length direction of the substrate, a size of at least one first active pattern is less than a size of at least one second active pattern.

18. The manufacturing method according to claim 15, further comprising: forming metal patterns on a side of the second scanning signal patterns away from the substrate, wherein orthographic projections of the metal patterns on the substrate overlap with orthographic projections of the second scanning signal patterns on the substrate, and the metal patterns are configured to receive voltage signals.

* * * * *